US008766343B2

(12) United States Patent
Kang et al.

(10) Patent No.: US 8,766,343 B2
(45) Date of Patent: Jul. 1, 2014

(54) INTEGRATED CIRCUIT CAPACITORS HAVING SIDEWALL SUPPORTS

(75) Inventors: Dae-Hyuk Kang, Hwaseong-si (KR); Bo-Un Yoon, Seoul (KR); Kun-Tack Lee, Suwon-si (KR); Woo-Gwan Shim, Yongin-si (KR); Ji-Hoon Cha, Seoul (KR); Im-Soo Park, Seongnam-si (KR); Hyo-San Lee, Suwon-si (KR); Young-Hoo Kim, Hwaseong-si (KR); Jung-Min Oh, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/356,032

(22) Filed: Jan. 23, 2012

(65) Prior Publication Data

US 2012/0112317 A1 May 10, 2012

Related U.S. Application Data

(63) Continuation of application No. 12/906,184, filed on Oct. 18, 2010, now Pat. No. 8,119,476.

(30) Foreign Application Priority Data

Dec. 24, 2009 (KR) ........................ 10-2009-0130973
Jan. 12, 2010 (KR) ........................ 10-2010-0002838

(51) Int. Cl.
*H01L 27/108* (2006.01)
*H01L 29/94* (2006.01)

(52) U.S. Cl.
USPC ............. 257/296; 438/239; 257/E21.648; 257/E27.089

(58) Field of Classification Search
USPC .......................................... 438/254
See application file for complete search history.

(56) References Cited

U.S. PATENT DOCUMENTS 7,320,911 B2    1/2008  Basceri et al.
7,459,362 B2 *  12/2008  Juengling ............. 438/253
(Continued)

FOREIGN PATENT DOCUMENTS

KR    1020060029731 A    4/2006
KR    1020090005919 A    1/2009
(Continued)

OTHER PUBLICATIONS

Viana et al. "Analysis of SiO2 Thin Films Deposited by PECVD Using an Oxygen-TEOS-Argon Mixture" Brazilian Journal of Physics, vol. 31, No. 2, Jun. 2001.*

*Primary Examiner* — W. Wendy Kuo
*Assistant Examiner* — Shaka White
(74) *Attorney, Agent, or Firm* — Myers Bigel Sibley & Sajovec, PA

(57) ABSTRACT

In a method of forming a capacitor, a first mold layer pattern including a first insulating material may be formed on a substrate. The first mold layer pattern may have a trench. A supporting layer including a second insulating material may be formed in the trench. The second insulating material may have an etching selectivity with respect to the first insulating material. A second mold layer may be formed on the first mold layer pattern and the supporting layer pattern. A lower electrode may be formed through the second mold layer and the first mold layer pattern. The lower electrode may make contact with a sidewall of the supporting layer pattern. The first mold layer pattern and the second mold layer may be removed. A dielectric layer and an upper electrode may be formed on the lower electrode and the supporting layer pattern.

20 Claims, 40 Drawing Sheets

(56) References Cited

U.S. PATENT DOCUMENTS

| | | | |
|---|---|---|---|
| 2003/0085420 A1* | 5/2003 | Ito et al. | 257/309 |
| 2005/0099760 A1* | 5/2005 | Park | 361/306.3 |
| 2005/0161720 A1* | 7/2005 | Park | 257/296 |
| 2005/0167724 A1 | 8/2005 | Choi et al. | 257/308 |
| 2006/0261440 A1* | 11/2006 | Manning | 257/532 |
| 2009/0257169 A1* | 10/2009 | Chen et al. | 361/301.4 |

FOREIGN PATENT DOCUMENTS

| | | |
|---|---|---|
| KR | 1020090022678 A | 3/2009 |
| KR | 1020090041168 A | 4/2009 |
| KR | 1020090045439 A | 5/2009 |

* cited by examiner

INTEGRATED CIRCUIT CAPACITORS HAVING SIDEWALL SUPPORTS

REFERENCE TO PRIORITY APPLICATIONS

This is a continuation of U.S. patent application Ser. No. 12/906,184, filed Oct. 18, 2010, now U.S. Pat. No. 8,119,476, which claims priority to Korean Patent Application Nos. 10-2009-130973, filed Dec. 24, 2009, and 10-2010-002838, filed Jan. 12, 2010, the contents of which are hereby incorporated herein by reference.

FIELD

This invention relates to methods of forming capacitors and methods of manufacturing dynamic random access memory (DRAM) devices using the same.

BACKGROUND OF THE INVENTION

As semiconductor devices become more highly integrated, a horizontal area of a unit cell on a semiconductor substrate may be gradually decreased. Although the horizontal area of the unit cell on the semiconductor substrate may be gradually decreased, it may be required to maintain a sufficiently high capacitance of a capacitor for storing charges in the semiconductor device. In order to maintain the capacitance of the capacitor, a height of a lower electrode may be increased to enlarge a contact area between the lower electrode and a dielectric layer.

However, the increased height of the lower electrode may cause the lower electrode to collapse because its aspect ratio is too high. Further, the high aspect ratio of the lower electrode may cause bending of a central portion or an upper portion of the lower electrode, so that adjacent lower electrodes may make contact with each other. Thus, a capacitor having a high capacitance and reduced susceptibility to collapse may be required.

SUMMARY

Methods of forming integrated circuit capacitors according to embodiments of the invention include forming a first cylindrical capacitor electrode having a U-shaped cross-section, on a substrate, and then forming an electrically insulating support that directly contacts and wraps around at least a first portion of an outer surface of the first cylindrical capacitor electrode. A capacitor dielectric layer is formed on an interior surface of the first cylindrical capacitor electrode, a second portion of an outer surface of the first cylindrical capacitor electrode not covered by the electrically insulating support and also on the electrically insulating support. The capacitor dielectric layer includes an electrically insulating material different from the electrically insulating support. Thereafter, an upper capacitor electrode is formed on the capacitor dielectric layer and on a portion of the electrically insulating support that is separated from the upper capacitor electrode by the capacitor dielectric layer.

According to additional embodiments of the invention, the methods include forming a second cylindrical capacitor electrode having a U-shaped cross-section, adjacent the first cylindrical capacitor electrode. According to these embodiments of the invention, the step of forming an electrically insulating support includes forming an electrically insulating support that directly contacts and wraps around at least a first portion of an outer surface of the second cylindrical capacitor electrode.

Additional embodiments of the invention include forming an integrated circuit capacitor by forming a first mold layer of a first material on a substrate and forming a trench in an upper surface of the first mold layer. A second mold layer is formed in the trench and on an upper surface of the first mold layer. The second mold layer includes a second material different from the first material. These methods also include forming an opening that extends through at least a portion of the second mold layer in the trench and at least partially through the first mold layer at a location adjacent a bottom of the trench. A U-shaped capacitor electrode is then formed in the opening. Thereafter, at least a portion of the first mold layer is selectively removed to expose at least a portion of the second mold layer that at least partially wraps around the U-shaped capacitor electrode. An exterior portion of the U-shaped capacitor electrode and the exposed portion of the second mold layer is then covered with a capacitor dielectric layer, and an upper capacitor electrode is formed on the capacitor dielectric layer.

According to some of these embodiments of the invention, the step of selectively removing at least a portion of the first mold layer is preceded by selectively etching back the second mold layer to expose a sidewall of the trench. In addition, the step of selectively removing at least a portion of the first mold layer includes etching the first mold layer using an etchant that is selective to the first mold layer relative to the second mold layer.

BRIEF DESCRIPTION OF THE DRAWINGS

Example embodiments will be more clearly understood from the following detailed description taken in conjunction with the accompanying drawings. FIGS. 1 to 21 represent non-limiting, example embodiments as described herein.

FIGS. 2 and 3 are plan views illustrating the method of forming the capacitor of FIGS. 1A-1H;

FIG. 4 is a perspective view illustrating the method of forming the capacitor of FIGS. 1A-1H;

FIG. 16 is a block diagram illustrating a memory system in accordance with some example embodiments of the invention;

FIG. 17 is a block diagram illustrating a memory system in accordance with some example embodiments of the invention;

FIG. 18 is a block diagram illustrating a memory system in accordance with some example embodiments of the invention;

FIG. 19 is a block diagram illustrating a memory system in accordance with some example embodiments of the invention;

FIG. 20 is a block diagram illustrating a memory system in accordance with some example embodiments of the invention; and FIG. 21 is a block diagram illustrating a memory system in accordance with some example embodiments of the invention.

DETAILED DESCRIPTION OF THE EMBODIMENTS

Figure 1A:
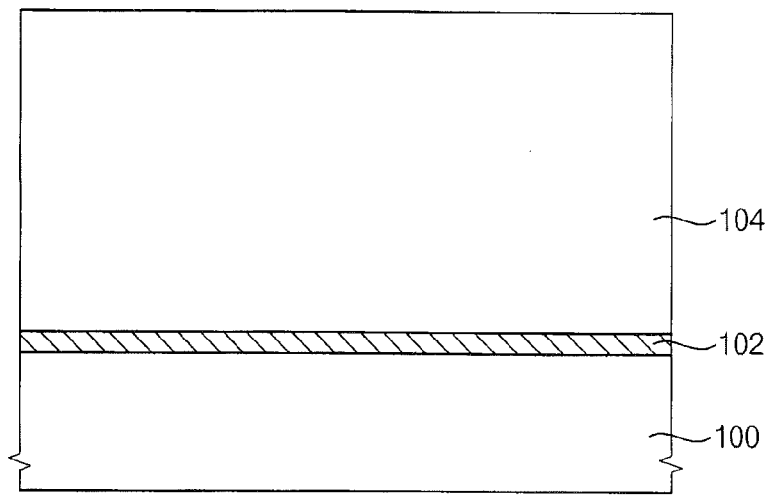
FIGS. 1A to 1H are cross-sectional views illustrating a method of forming a capacitor in accordance with some example embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be explained in detail with reference to the accompanying drawings.

Figure 1B:
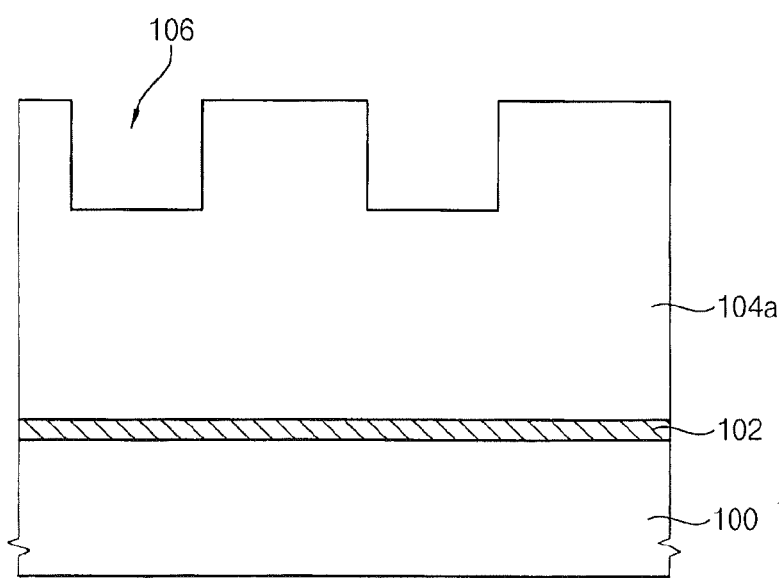
Figure 1C:
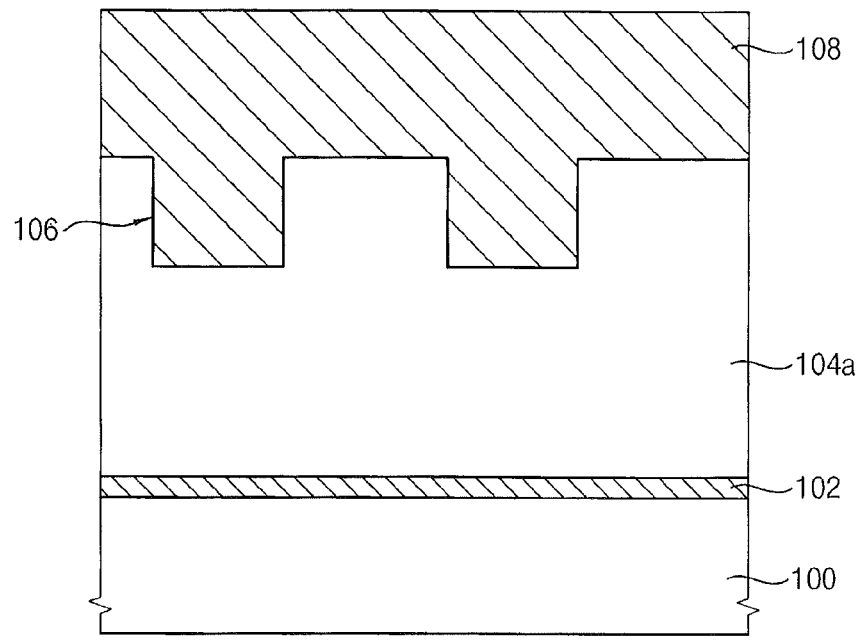
Figure 1D:
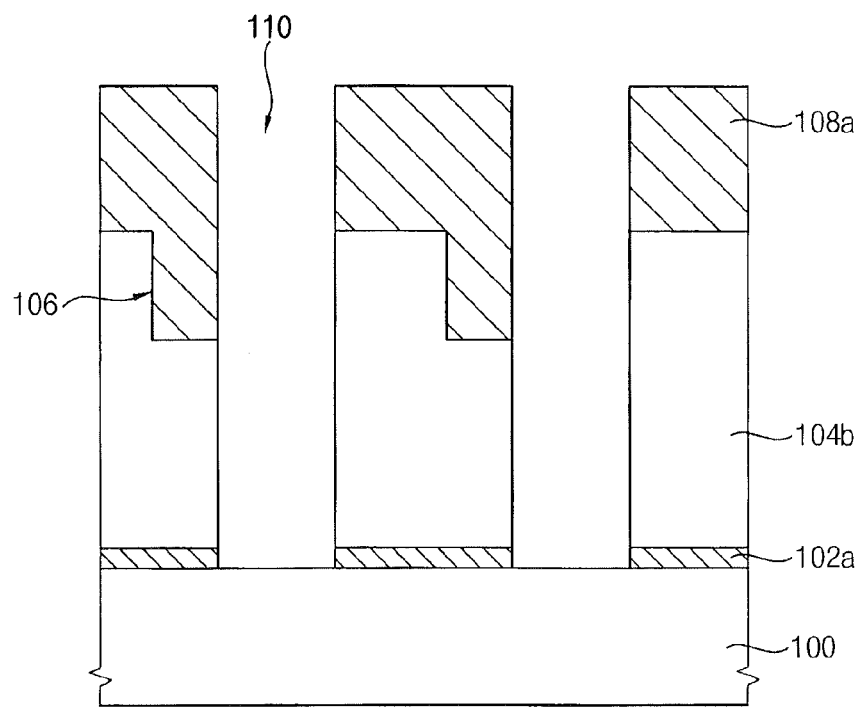
Figure 1E:
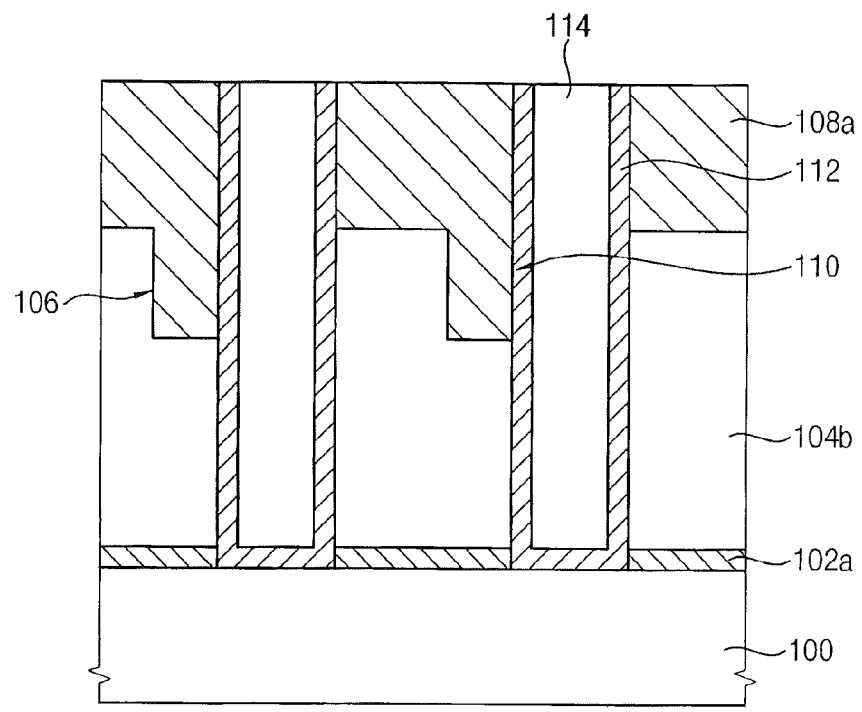
Figure 1F:
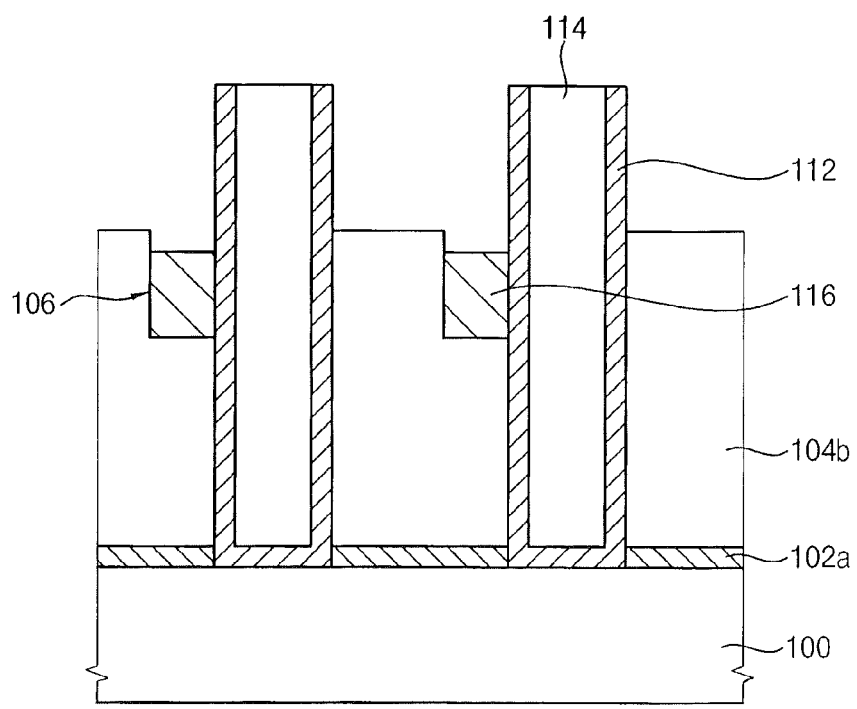
Figure 1G:
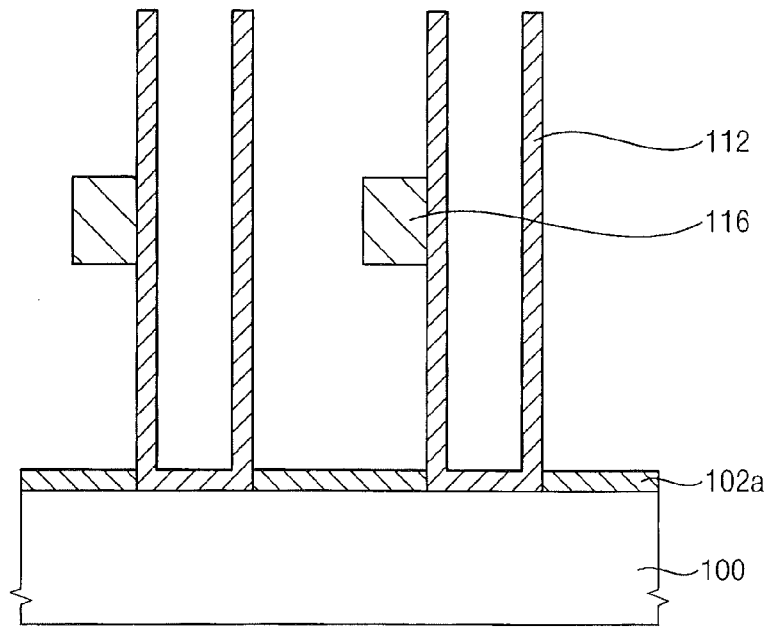
Figure 1H:
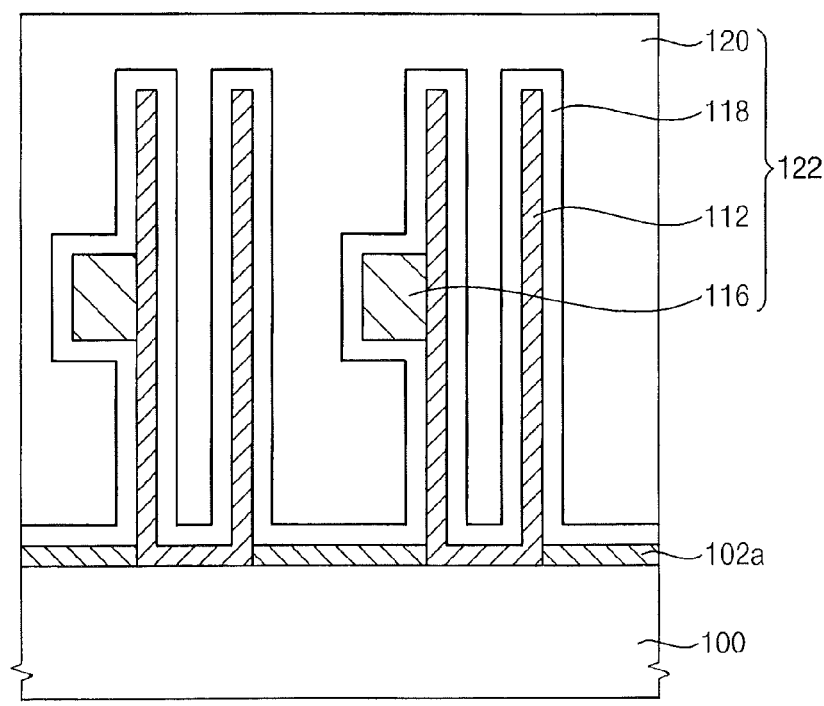
Figure 2:
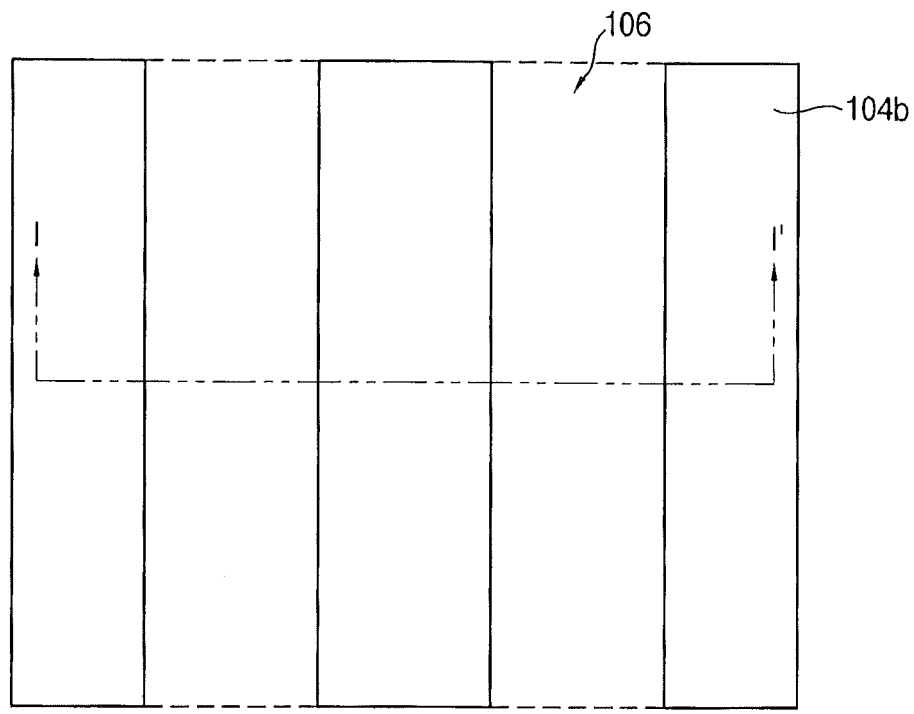
Figure 3:
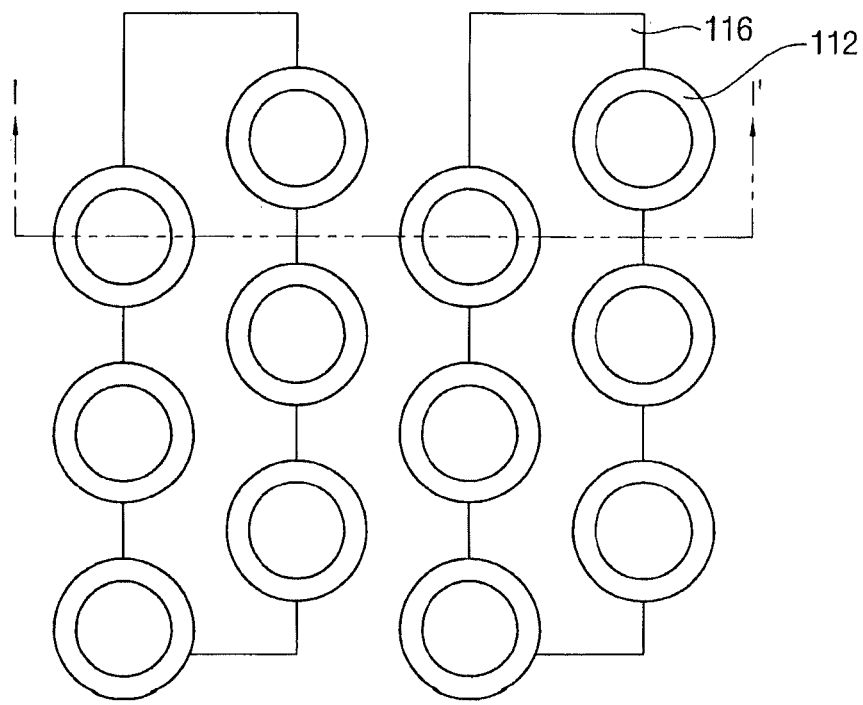
Figure 4:
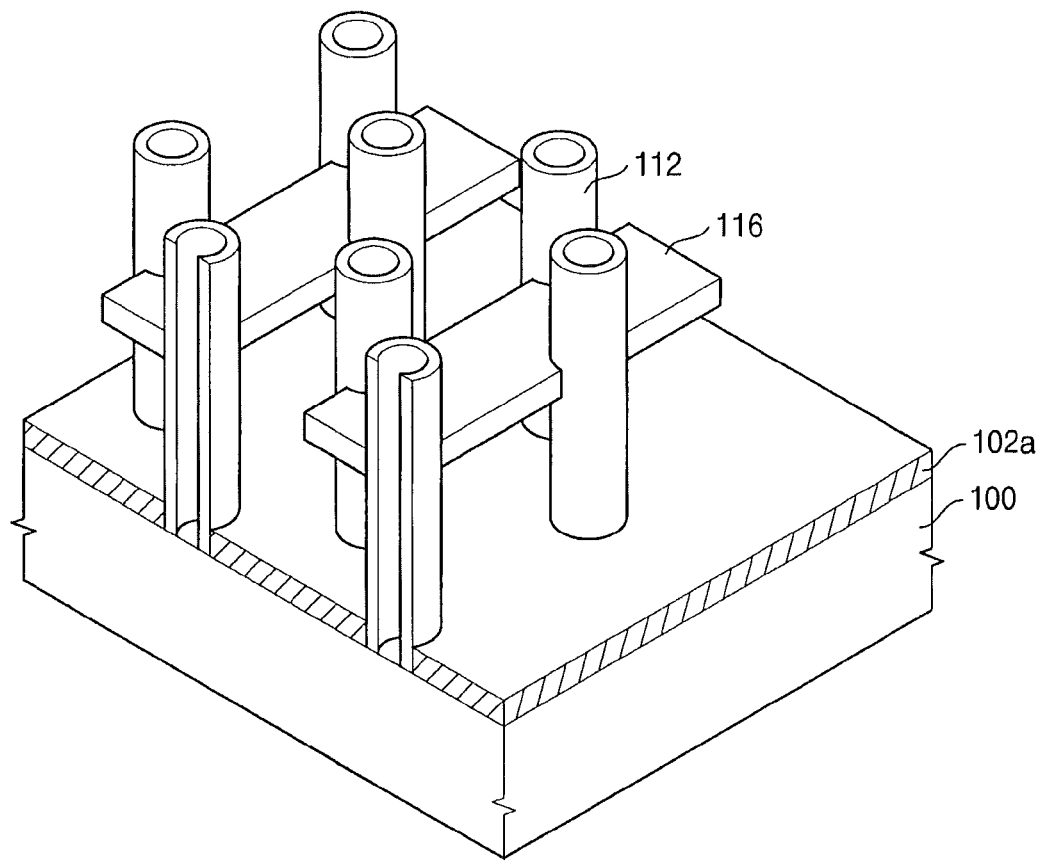

FIGS. 1A to 1H are cross-sectional views illustrating a method of forming a capacitor in accordance with some example embodiments, FIGS. 2 and 3 are plan views illustrating the method of forming the capacitor, and FIG. 4 is a perspective view illustrating the method of forming the capacitor. Here, FIGS. 1A to 1H are cross-sectional views taken along a line I-I' in FIGS. 2 and 3.

Referring to FIG. 1A, a semiconductor substrate 100 may be prepared. In some example embodiments, lower patterns (not shown) and semiconductor structures (not shown) may be formed on the semiconductor substrate 100. An etch stop layer 102 may be formed on the semiconductor substrate 100. The etch stop layer 102 may function as an endpoint of an etching process for etching a mold layer. Further, the etch stop layer 102 may function as to protect the lower patterns and the semiconductor structures. Thus, the etch stop layer 102 may include a material having an etching selectivity with respect to the mold layer. In some example embodiments, the etch stop layer 102 may include silicon nitride.

A first mold layer 104 may be formed on the etch stop layer 102. In some example embodiments, the first mold layer 104 may include silicon oxide. Further, the first mold layer 104 may include silicon oxide doped with impurities such as fluorine, boron, phosphorus, etc. For example, the first mold layer 104 may include borophosphosilicate glass (BPSG), fluorosilicated glass (FSG), phosphosilicate glass (PSG), etc. These may be used alone or in a combination thereof. Here, a supporting layer pattern for supporting a lower electrode may be formed under an upper surface of the first mold layer 104 by following processes. Therefore, a position of the supporting layer pattern may be controlled by changing a height of the first mold layer 104.

Referring to FIG. 1B, a photoresist pattern (not shown) may be formed on the first mold layer 104. An upper surface of the first mold layer 104 may be anisotropically etched using the photoresist pattern as an etch mask to form trenches 106. Thus, the first mold layer 104 may be converted into a first preliminary mold layer pattern 104a having the trenches 106. As mentioned above, the supporting layer pattern may be formed in each of the trenches 106. Thus, the trench 106 may have a shape substantially identical to a desirable shape of the supporting layer pattern. That is, the supporting layer pattern may have a height dependent upon a depth of the trench 106. For example, the height of the supporting layer pattern may be substantially equal to or slightly less than the depth of the trench 106.

FIG. 2 is a plan view illustrating the first preliminary mold layer pattern. Referring to FIG. 2, each of the trenches 106 may have a linear shape. Thus, the supporting layer pattern formed in the trench 106 may also have a linear shape to support the lower electrode. Alternatively, the trench 106 may have a linear shape slantly arranged in accordance with arrangements of the lower electrodes. Further, the trench 106 may have an annular shape. Furthermore, the trench 106 may have a discontinuous linear shape.

Referring to FIG. 1C, a second mold layer 108 may be formed on the first preliminary mold layer pattern 104a to fill up the trenches 106. In some example embodiments, portions of the second mold layer 108 in the trenches 106 may serve as the supporting layer patterns.

In some example embodiments, heights of the first preliminary mold layer pattern 104a and the second mold layer 108 may determine a height of a lower electrode. Thus, the height of the lower electrode may be changed by controlling the height of the second mold layer 108. In order to provide the supporting layer pattern with a function for preventing a central portion of the lower electrode from leaning, the second mold layer 108 may have a height of no less than about 1,000 Å.

In some example embodiments, the second mold layer 108 may include a material having a high etching selectivity with respect to the first preliminary mold layer pattern 104a. Further, the second mold layer 108 may include elements in the first preliminary mold layer pattern 104a. The second mold layer 108 may include silicon oxide having a high etching selectivity with respect to the first preliminary mold layer pattern 104a. For example, the second mold layer 108 may include silicon oxide non-doped with impurities. The second mold layer 108 may include undoped silicate glass (USG), spin on glass (SOG), tetraethyl orthosilicate (TEOS), plasma-enhanced tetraethyl orthosilicate (PE-TEOS), etc. Alternatively, the second mold layer 108 may include high-density plasma chemical vapor deposition (HDP-CVD) oxide, plasma-enhanced chemical vapor deposition (PE-CVD) oxide, low-pressure chemical vapor deposition (LP-CVD) oxide, etc.

In some example embodiments, the silicon oxide non-doped with the impurities may have good gap-filling characteristics compared to that of the silicon oxide doped with the impurities. When the second mold layer 108 may include the silicon oxide non-doped with the impurities, voids or seams may not be generated in the second mold layer 108 in the trench 106. Further, because the portions of the second mold layer 108 in the trenches 106 may be used for the supporting layer pattern, the second mold layer 108 may have a dense atomic bond without vacancy. Thus, the second mold layer 108 may desirably include the HDP-CVD oxide. Alternatively, the second mold layer 108 may include silicon nitride having a high etching selectivity with respect to the first preliminary mold layer pattern 104a.

Furthermore, as mentioned above, the portions of the second mold layer 108 in the trenches 106 may be converted into the supporting layer pattern for supporting the lower electrode by following processes. Thus, the second mold layer 108 may include a material capable of preventing cracks generated by stresses between the supporting layer pattern and the lower electrode and having firm adhesive characteristic with respect to the lower electrode. The stresses in the supporting layer patterns may be controlled by varying process conditions of the second mold layer 108. Additionally, the second mold layer 108 may be planarized. Alternatively, the planarization process may be omitted.

Referring to FIG. 1D, a mask pattern (not shown) may be formed on the first preliminary layer pattern 104a and the second mold layer 108. In some example embodiments, the mask pattern may include a photoresist pattern. The mask pattern may have openings configured to expose portions of the second mold layer 108 where the lower electrode may be to be formed. The second mold layer 108, the first preliminary mold layer pattern 104a and the etch stop layer 102 may be anisotropically etched to form openings 110, thereby forming a second mold layer pattern 108a, a first mold layer pattern 104b and an etch stop layer pattern 102a.

A lower conductive pattern (not shown) or the semiconductor substrate 100 may be exposed through the openings 110. A cylindrical lower electrode may be formed on a side surface and a bottom surface of each of the openings 110 by following processes.

In some example embodiments, the opening 110 may be partially formed through the trench 106. That is, the portion of the second mold layer pattern 108a in the trench 106 may be exposed through the side surface of the opening 110. As a result, the portion of the second mold layer pattern 108a may make contact with a sidewall of the lower electrode to support the lower electrode.

Referring to FIG. 1E, a conductive layer (not shown) may be formed on the side surface and the bottom surface of the openings 110 and an upper surface of the second mold layer pattern 108a. In some example embodiments, the conductive layer may include a metal such as titanium or metal nitride such as titanium nitride. The conductive layer may be formed by a chemical vapor deposition (CVD) process.

A sacrificial layer (not shown) may be formed on the conductive layer to fill up the openings 110. In some example embodiments, the sacrificial layer may include a material having an etching selectivity with respect to the second mold layer pattern 108a. The sacrificial layer may include a material having an etching selectivity substantially the same as or similar to the first mold layer pattern 104b. For example, the sacrificial layer may include oxide doped with impurities. The sacrificial layer may include silicon oxide having at least one of fluorine, boron and phosphorus such as BPSG, FSG or PSG. These may be used alone or in a combination thereof. Alternatively, the sacrificial layer may include silicon oxide formed by an atomic layer deposition (ALD) process. Further, the sacrificial layer may include photoresist readily removed by an ashing process.

The sacrificial layer and the conductive layer may be removed by a chemical mechanical polishing (CMP) process or an etch-back process until the upper surface of the second mold layer pattern 108a may be exposed to form the cylindrical lower electrode 112. Further, a sacrificial layer pattern 114 may be formed in the opening by the removal process.

Referring to FIG. 1F, the second mold layer pattern 108a may be etched until the upper surface of the first mold layer pattern 104b may be exposed. Here, the portion of the second mold layer pattern 108a in the trench 106 may remain, not be removed. The portion of the second mold layer pattern 108 in the trench 106 may remain by controlling an etch time determined, considered an etch rate of the second mold layer pattern 108a. After the second mold layer pattern 108a may be partially etched, linear supporting layer patterns 116 may be formed in the trenches 106. The linear supporting layer pattern 116 may partially make contact with the sidewall of the lower electrode 112 to support the lower electrode 112.

In some example embodiments, it may be required to prevent damages to the lower electrode 112 during etching the second mold layer pattern 108a. Thus, the second mold layer pattern 108a may be removed by an anisotropic etching process. The anisotropic etching process may use an etchant having a relatively high etch rate with respect to the second mold layer pattern 108a than the first mold layer pattern 104b.

In some example embodiments, the etchant used for etching the second mold layer pattern 108a may include a buffered oxide etch (BOE) solution containing hydrogen fluoride (HF), ammonium hydrogen fluoride (NH$_4$F) and deionized water. The BOE solution may have a relatively high etching selectivity with respect to the silicon oxide non-doped with the impurities than the silicon oxide doped with the impurities. However, because the BOE solution may have a slow etch rate with respect to the second mold layer pattern 108a, the supporting layer pattern 116 may be formed by controlling the etch time of the second mold layer pattern 108a. As a result, the supporting layer pattern 116 may be formed in the trench 106 using the BOE solution.

Referring to FIG. 10, the first mold layer pattern 104b and the sacrificial layer pattern 114 may be etched. The supporting layer pattern 116 may still remain on the sidewall of the lower electrode 112. In some example embodiments, it may be required to prevent damages to the supporting layer pattern 116 during etching the first mold layer pattern 104b. Thus, the etching process for removing the first mold layer pattern 104b may use an etchant having a relatively high etching selectivity with respect to the silicon oxide doped with the impurities than the silicon oxide non-doped with the impurities. For example, the etchant may have the etching selectivity with respect to the silicon oxide doped with the impurities by no less than about 5 times than the silicon oxide non-doped with the impurities.

In some example embodiments, before etching the first mold layer pattern 104b and the sacrificial layer pattern 114, upper surfaces of the first mold layer pattern 104b and the sacrificial layer pattern 114 may be additionally treated to remove a native oxide layer on the upper surfaces of the first mold layer pattern 104b and the sacrificial layer pattern 114. The first mold layer pattern 104b and the sacrificial layer pattern 114 may be effectively etched by the surface treatment of the first mold layer pattern 104b and the sacrificial layer pattern 114.

In some example embodiments, the surface treatment process may include a wet cleaning process using a diluted hydrogen fluoride solution. Alternatively, the surface treatment process may include a dry cleaning process using any one of a diluted hydrogen fluoride gas and an ammonia gas, and a hydrogen fluoride gas and an alcohol. Further, the surface treatment process may include a dry cleaning process using any one of hydrogen fluoride and ammonia in plasma state as a main gas. Additionally, at least one of a hydrogen gas, a nitrogen gas and an ammonia gas together with the main gas may be used in the dry cleaning process. The surface treatment process may prevent an undoped oxide layer between a first mold layer 126 and a second mold layer 132 formed later.

In some example embodiments, after performing the surface treatment process, the etching process with respect to the first mold layer pattern 104b and the sacrificial layer pattern 114 may use a hydrofluoric gas. The etching process may be performed in an etching chamber having a controllable pressure.

In some example embodiments, the etching process may use a vapor containing hydrogen fluoride. The vapor may be manufactured by preparing a hydrofluoric solution including hydrogen fluoride and deionized water, and vaporizing the hydrofluoric solution. For example, a solution including about 35% to about 45% by weight of hydrogen fluoride and a remaining deionized water. The solution may then be vaporized to form the vapor containing hydrogen fluoride. The etching process may be performed at a temperature of about 15° C. to about 100° C.

In some example embodiments, the etching process may use a solution including hydrogen fluoride, an organic solvent, a surfactant and deionized water. The organic solvent may include a material having a dielectric constant of no more than about 30 dyn/cm$^2$ such as alcohol, tricarboxylic acid, ketone, ether, ester, etc. Particularly, the solution may include about 0.01% to about 10% by weight of hydrogen fluoride, an organic solvent, about 0.0001% to about 2% by weight of a surfactant and about 0.01% to about 10% by weight of deionized water. The solution may include SFMd-5 (product name, manufactured by Daikin in Japan). The etching process may be performed at a temperature of about 15° C. to about 100° C. The etching process may be performed in a batch type apparatus where the semiconductor substrate 100 may be dipped into the etchant, a spin type apparatus, etc.

In some example embodiments, the etchant may include sulfuric acid, hydrogen fluoride and deionized water. For example, the etchant may include about 70% to about 99% by weight of sulfuric acid, about 0.01% to about 10% by weight of hydrogen fluoride and deionized water. The etching process may be performed at a temperature of about 15° C. to about 100° C. The etching process may be performed in a batch type apparatus where the semiconductor substrate 100 may be dipped into the etchant, a spin type apparatus, etc.

FIG. 3 is a plan view illustrating the lower electrode and the supporting layer pattern, and FIG. 4 is a perspective view illustrating the lower electrode and the supporting layer pattern. Referring to FIGS. 3 and 4, the supporting layer pattern 116 may have a linear shape. The supporting layer pattern 116 may be configured to make contact with the sidewall of the lower electrode 112. Thus, the linear supporting layer pattern 116 may support the adjacent lower electrodes 112. In some example embodiments, the supporting layer pattern 116 may include a material having high density and good gap-filling characteristic. Thus, process failures during forming the supporting layer pattern 116 may be decreased.

In some example embodiments, when the supporting layer pattern 116 may include silicon oxide, stresses between the supporting layer pattern 116 and the lower electrode 112 may be reduced compared to when the supporting layer pattern 116 may include silicon nitride.

Referring to FIG. 1H, a dielectric layer 118 may be formed on the lower electrode 112 and the supporting layer pattern 116. In some example embodiments, the dielectric layer 118 may include silicon oxide or a material having a high dielectric constant. An upper electrode 120 may be formed on the dielectric layer 118. In some example embodiments, the upper electrode 120 may include polysilicon doped with impurities, metal, metal nitride, etc.

According to this example embodiment, a position of the supporting layer pattern may be adjusted by changing the heights of the first mold layer and the second mold layer. Thus, the supporting layer pattern may be readily arranged on the central portion of the sidewall of the lower electrode, so that the central portion of the lower electrode may not lean or be bent. Further, the supporting layer pattern may be formed by a damascene process including filling the trench with the oxide layer non-doped with impurities, and polishing the oxide layer. Thus, because the trench may be filled with the oxide layer having good gap-filling characteristic, process failures generated during forming the supporting layer pattern may be reduced.

Figure 5A:
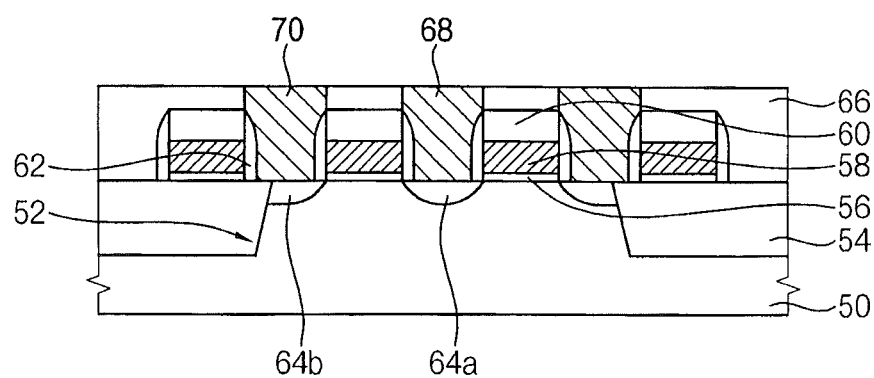
FIGS. 5A to 5C are cross-sectional views illustrating a method of manufacturing a DRAM device including the capacitor in FIG. 1H.
Figure 5B:
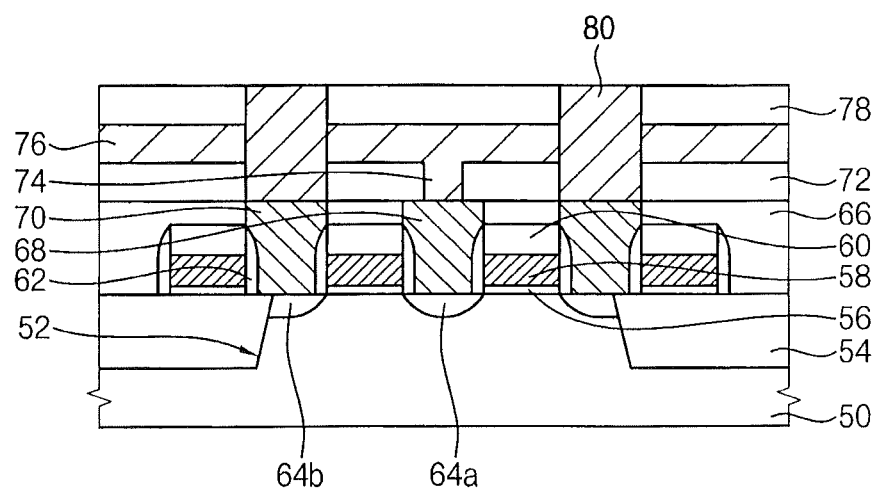
Figure 5C:
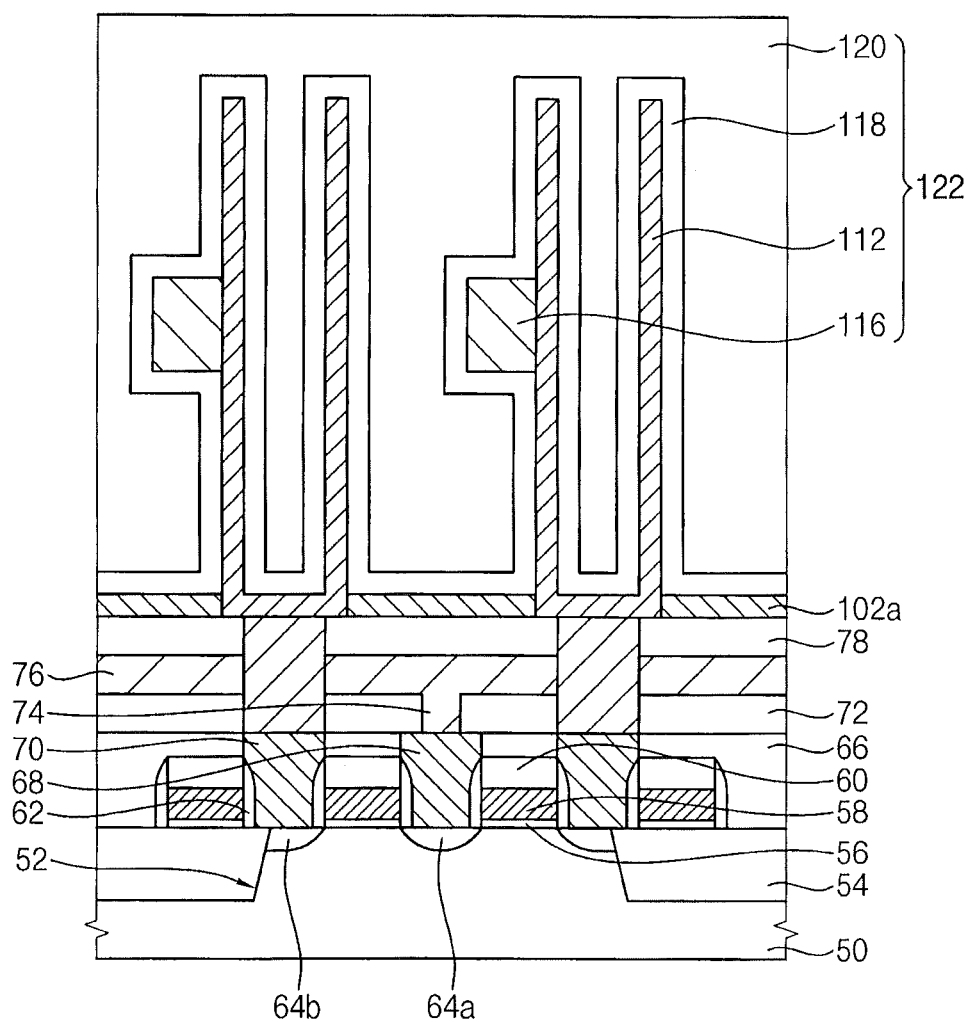

FIGS. 5A to 5C are cross-sectional views illustrating a method of manufacturing a DRAM device including the capacitor in FIG. 1H. Referring to FIG. 5A, a pad oxide layer (not shown) and a silicon nitride layer (not shown) may be sequentially formed on a semiconductor substrate 50. In some example embodiments, the semiconductor substrate 50 may include a silicon substrate, a germanium substrate, a silicon-germanium substrate, a silicon-on-insulator substrate, a germanium-on-insulator substrate, etc. A photoresist pattern (not shown) may be formed on the silicon nitride layer. The silicon nitride layer and the pad oxide layer may be etched using the photoresist pattern as an etch mask to form a first hard mask pattern (not shown) including a pad oxide layer pattern and a silicon nitride layer pattern.

The semiconductor substrate 50 may be etched using the first hard mask pattern as an etch mask to form a trench 52. A silicon oxide layer having good gap-filling characteristic may be formed on the semiconductor substrate to fill up the trench 52. The silicon oxide layer may be removed by a CMP process or an etch-back process to form an isolation layer pattern 54 in the trench 52. The isolation layer pattern 54 may define a field region and an active region of the semiconductor substrate 50.

A gate oxide layer 56 may be formed on the semiconductor substrate 50. A gate structure may be formed on the gate oxide layer 56. In some example embodiments, the gate structure may include a gate electrode 58 and a second hard mask pattern 60 sequentially stacked. A spacer 62 may be formed on a sidewall of the gate structure. In some example embodiments, the spacer 62 may include silicon nitride. Impurities may be implanted into the semiconductor substrate 50 using the gate structure and the spacer 62 as an ion implantation mask to form a first impurity region 64a and a second impurity region 64b at both sides of the gate structure. The first impurity region 64a and the second impurity region 64b may function as source/drain regions.

A first insulating interlayer 66 may be formed on the semiconductor substrate 50 to cover the gate structure. A first contact pad 68 and a second contact pad 70 may be formed through the first insulating interlayer 66. The first contact pad 68 and the second contact pad 70 may make contact with the first impurity region 64a and the second impurity region 64b, respectively.

Referring to FIG. 5B, a second insulating interlayer 72 may be formed on the first insulating interlayer 66. A bit line contact 74 may be formed through the second insulating interlayer 72. The bit line contact 74 may make contact with the first contact pad 68. Thus, the bit line contact 74 may be electrically connected to the first impurity region 64a through the first contact pad 68. A bit line 76 may be formed on the second insulating interlayer 72 and the bit line contact 74.

A third insulating interlayer 78 may be formed on the second insulating interlayer 72 to cover the bit line 76. In some example embodiments, the third insulating interlayer 78 may be formed by a CVD process using silicon oxide. The third insulating interlayer 78 and the second insulating interlayer 72 may be partially etched to form contact holes (not shown) exposing an upper surface of the second contact pad 70. The contact holes may be filled with a conductive layer (not shown). The conductive layer may be planarized to form a storage node contact 80. The storage node contact 80 may be electrically connected to the second impurity region 64b through the second contact pad 70.

Referring to FIG. 5C, an etch stop layer 102a may be formed on the third insulating interlayer 78. A capacitor 122 may be electrically connected with the storage node contact 80. Here, the capacitor 122 may be formed by processes substantially the same as those illustrated with reference to FIGS. 1A to 1H. Thus, any further illustrations with respect to the processes are omitted herein for brevity. Here, it may be required to partially expose the storage node contact 80 through the opening 110. According to this example embodiment, the capacitor may include the supporting layer pattern including silicon oxide. Further, the capacitor may have a high capacitance. Moreover, a DRAM device including the capacitor may be manufactured.

Figure 6A:
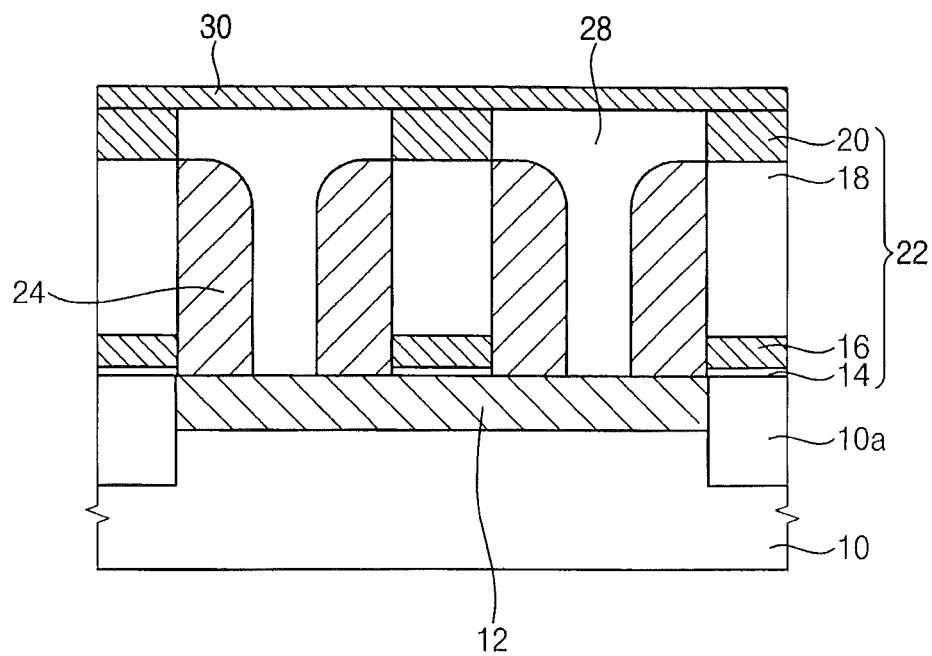
FIGS. 6A to 6D are cross-sectional views illustrating a method of manufacturing a DRAM device in accordance with some example embodiments of the invention.

FIGS. 6A to 6D are cross-sectional views illustrating a method of manufacturing a DRAM device in accordance with some example embodiments. Here, the DRAM device may include a vertical pillar transistor. Referring to FIG. 6A, a shallow trench isolation (STI) process may be performed on a semiconductor substrate 10 to define an active region and an isolation region 10a of the semiconductor substrate 10. In some example embodiments, the active region may have regularly arranged isolated patterns. An impurity doping process may be performed on the semiconductor substrate 10 to form a first impurity region 12. Additionally, a channel doping process may be performed on the semiconductor substrate to control a threshold voltage of a transistor.

A single crystalline epitaxial pattern 28 may be formed on the semiconductor substrate 10 in the active region. In some example embodiments, a sacrificial layer structure 22 may be formed on the semiconductor substrate 10. The sacrificial layer structure 22 may have holes partially exposing the first impurity region 12. The sacrificial layer structure 22 may include a pad oxide layer 14, a first silicon nitride layer 16, a silicon oxide layer 18 and a second silicon nitride layer 20 sequentially stacked.

The two single crystalline epitaxial patterns 28 may be positioned in the unit active region. Thus, the two holes may be placed in the unit active region. An inner spacer 24 may be formed on an inner surface of each of the holes. The single crystalline epitaxial pattern 28 may be formed on the inner spacer 24 to fill up the hole. In some example embodiments, the single crystalline epitaxial pattern 28 may be formed by a laser epitaxial growth process that may include converting amorphous silicon using a laser. A protecting layer 30 may be formed on the single crystalline epitaxial pattern 28 and the sacrificial layer structure 22.

Figure 6B:
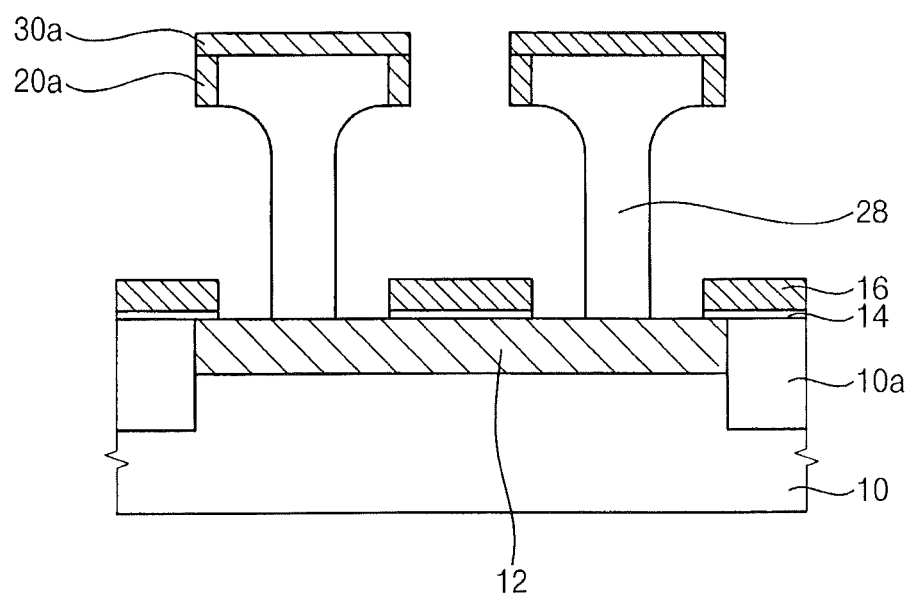

Referring to FIG. 6B, the protecting layer 30 and the sacrificial layer structure 22 may be patterned to form a protecting layer pattern 30a on an upper surface of the single crystalline epitaxial pattern 28 and a second silicon nitride layer pattern 20a on a side surface of the single crystalline epitaxial pattern 28. In contrast, the silicon oxide layer 18 may be entirely removed by the patterning process. Further, the pad oxide layer 14 and the silicon nitride layer 16 may remain to prevent the semiconductor substrate 10 from being exposed. The inner spacer 24 on the sidewall of the single crystalline epitaxial pattern 28 may be removed. In some example embodiments, the inner spacer 24 may be removed by an isotropic etching process.

Figure 6C:
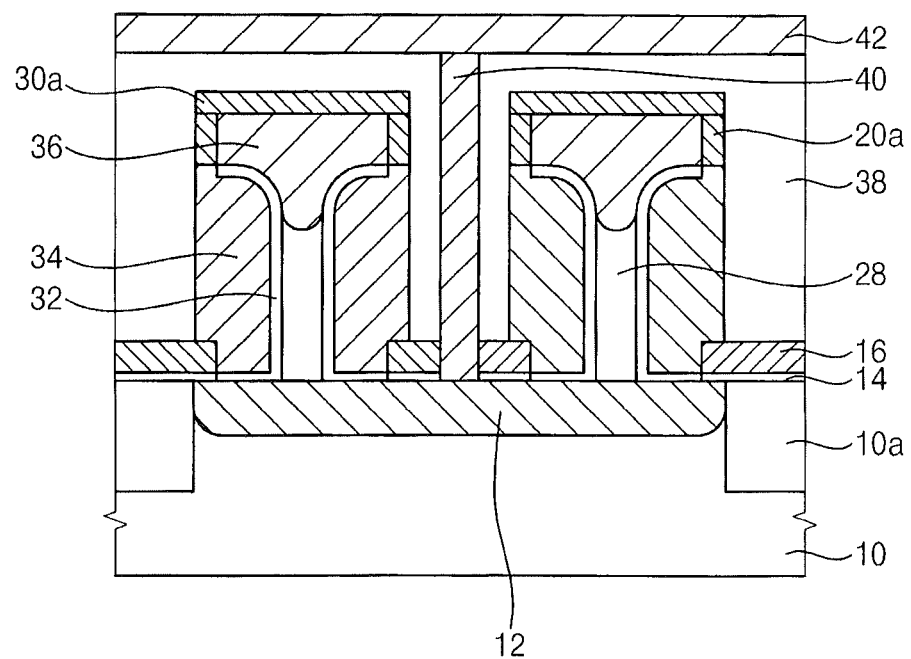

Referring to FIG. 6C, a gate insulating layer 32 may be formed on the sidewall of the single crystalline epitaxial pattern 28. In some example embodiments, the gate insulating layer 32 may be formed by a thermal oxidation process. A gate electrode 34 may be formed on the gate insulating layer 32. In some example embodiments, the gate electrode 34 may have a linear shape configured to surround the sidewall of the single crystalline epitaxial pattern 28.

Impurities may be implanted into an upper portion of the single crystalline epitaxial pattern 28 to form a second impurity region 36, thereby forming the vertical pillar transistor that may be used for a switching element of the DRAM cell. Alternatively, the second impurity region 36 may be formed between the process for forming the single crystalline epitaxial pattern 28 and the process for forming a first insulating interlayer 38.

The first insulating interlayer 38 may cover the vertical pillar transistor. The first insulating interlayer 38 may be etched to form a contact hole exposing an upper surface of the active region between the single crystalline epitaxial patterns 28. A first conductive layer (not shown) may be formed on the first insulating interlayer 38 to fill up the contact holes. In some example embodiments, the first conductive layer may serve as a bit line contact and a bit line. The first conductive layer may be formed by depositing at least two conductive materials. A hard mask pattern (not shown) may be formed on the first conductive layer. In some example embodiments, the hard mask pattern may have a linear shape extending in a direction substantially perpendicular to an extending direction of the gate electrode 34. The first conductive layer may be etched using the hard mask pattern as an etch mask to form a bit line contact 40 and a bit line 40. Alternatively, after forming the bit line contact 40, the bit line 42 may be formed on the first insulating interlayer 38 and the bit line contact 40.

Figure 6D:
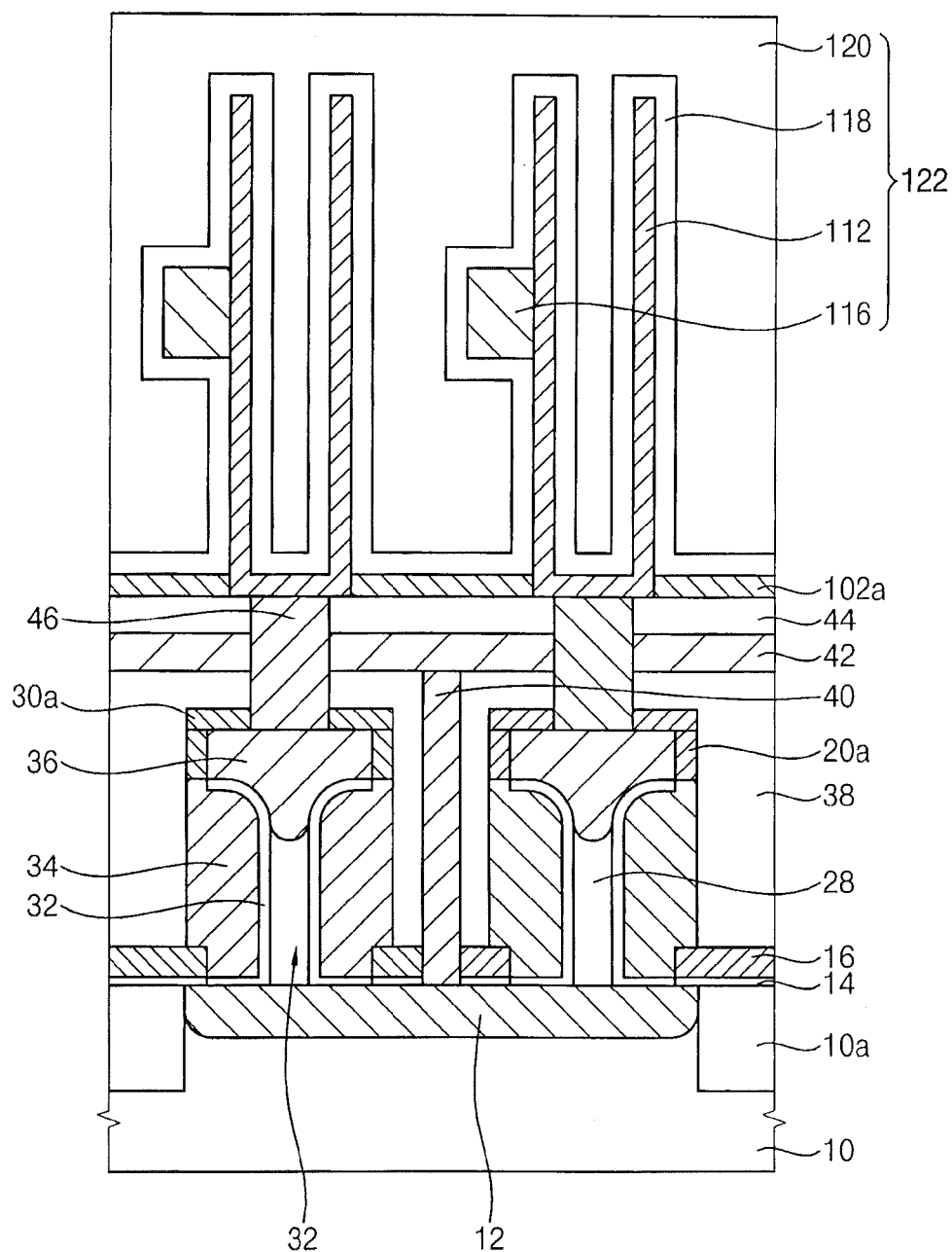

Referring to FIG. 6D, a second insulating interlayer 44 may cover the bit line 42. The second insulating interlayer 44, the first insulating interlayer 38 and the protecting layer pattern 30a may be etched to form contact holes exposing the upper surface of the single crystalline epitaxial pattern 28. The contact hole may be filled with a conductive material to form a storage node contact 46. An etch stop layer 102a may be formed on the second insulating interlayer 44. A capacitor 122 may be electrically connected with the storage node contact 80.

Here, the capacitor 122 may be formed by processes substantially the same as those illustrated with reference to FIGS. 1A to 1H. Thus, any further illustrations with respect to the processes are omitted herein for brevity. Here, it may be required to partially expose the storage node contact 46 through the opening 110. According to this example embodiment, the capacitor may include the supporting layer pattern including silicon oxide. Further, the capacitor may have a high capacitance. Moreover, a DRAM device including the capacitor may be manufactured.

Figure 7A:
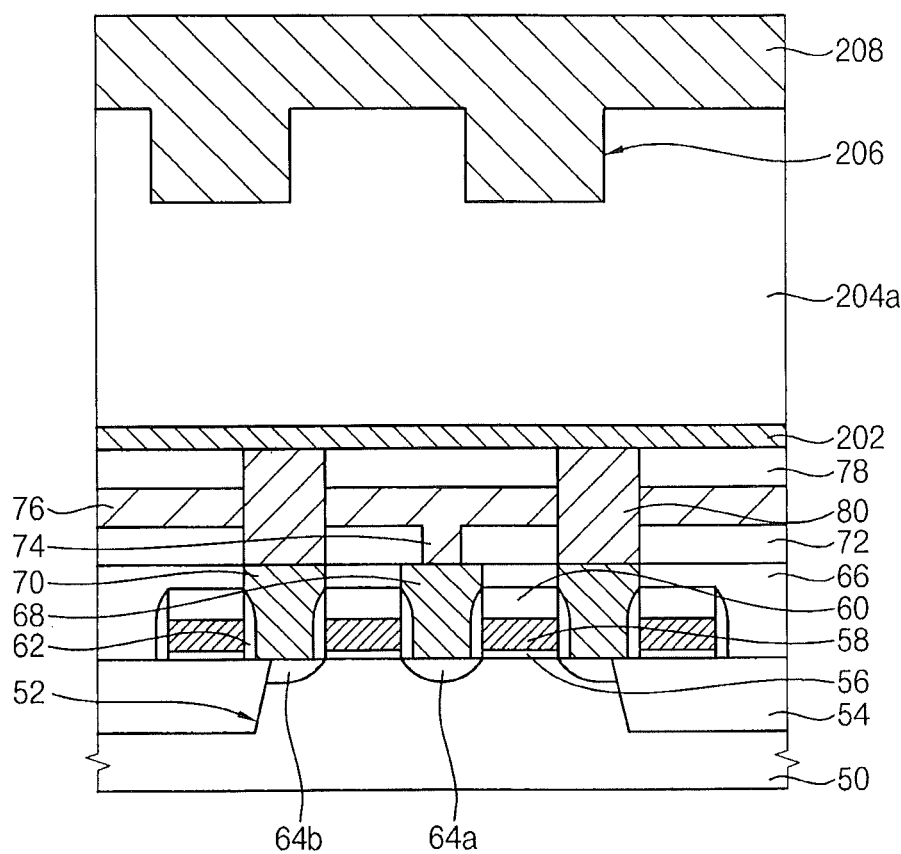
FIGS. 7A to 7E are cross-sectional views illustrating a method of manufacturing a DRAM device in accordance with some example embodiments of the invention.

FIGS. 7A to 7E are cross-sectional views illustrating a method of manufacturing a DRAM device in accordance with some example embodiments. Referring to FIG. 7A, a semiconductor substrate 200 may be prepared. In some example embodiments, lower structures (not shown) may be formed on the semiconductor substrate 200. In some example embodiments, the lower structure may include a transistor, a bit line, wirings, etc. The lower structure may be formed by processes substantially the same as those illustrated with reference to FIGS. 5A and 5B. Alternatively, the lower structure may be formed by processes substantially the same as those illustrated with reference to FIGS. 6A to 6D.

An etch stop layer 202 may be formed on the semiconductor substrate 200. A first mold layer (not shown) may be formed on the etch stop layer 202. In some example embodiments, the first mold layer may include silicon oxide doped with impurities such as fluorine, boron, phosphorus, etc. For example, the first mold layer may include borophosphosilicate glass (BPSG), fluorosilicated glass (FSG), phosphosilicate glass (PSG), etc. These may be used alone or in a combination thereof.

The first mold layer may be etched to form trenches 206. Thus, the first mold layer may be converted into a first preliminary mold layer pattern 204a having the trenches 206. In some example embodiments, the trenches 206 may be formed by processes substantially the same as those illustrated with reference to FIG. 2.

A supporting layer 208 may be formed on the first preliminary mold layer pattern 204a to fill up the trenches 206. In some example embodiments, the supporting layer 208 may include a material having a high etching selectivity with respect to the first mold layer. For example, the supporting layer 208 may include silicon oxide non-doped with impurities. The supporting layer 208 may include undoped silicate glass (USG), spin on glass (SOG), tetraethyl orthosilicate (TEOS), plasma-enhanced tetraethyl orthosilicate (PE-TEOS), etc. Alternatively, the supporting layer 208 may include high-density plasma chemical vapor deposition (HDP-CVD) oxide, plasma-enhanced chemical vapor deposition (PE-CVD) oxide, low-pressure chemical vapor deposition (LP-CVD) oxide, etc. In some example embodiments, the supporting layer 208 may have good gap-filling characteristics to prevent generations of voids or seams in the supporting layer 208. Further, portions of the supporting layer 208 in the trenches 206 may have a dense atomic bond without vacancy. Thus, the supporting layer 208 may desirably include the HDP-CVD oxide. Alternatively, the supporting layer 208 may include silicon nitride. Further, the supporting layer 208 may include an insulating material having an etching selectivity with respect to the first mold layer. Hereinafter, in this example embodiment, the supporting layer 208 may include the silicon oxide non-doped with the impurities. However, although the supporting layer 208 may include other materials, following processes may be applied to the supporting layer 208.

The supporting layer 208 may be planarized until an upper surface of the first preliminary mold layer pattern 204a may be exposed to form a preliminary supporting layer pattern 208a in the trench 206. In some example embodiments, the supporting layer 208 may be planarized by a CMP process or an etch-back process. A second mold layer 210 may be formed on the first preliminary mold layer pattern 204a and the preliminary supporting layer pattern 208a. In some example embodiments, the second mold layer 210 may include silicon oxide. Further, the second mold layer 210 may include a material substantially the same as that of the first mold layer.

In some example embodiments, before forming the second mold layer 210, upper surfaces of the first mold layer pattern 204*a* and preliminary supporting layer pattern 208*a* may be additionally treated to remove a native oxide layer on the upper surfaces of the first mold layer pattern 204*a*. The surface treatment process may be substantially the same as that illustrated with reference to FIG. 1G.

In some example embodiments, when the preliminary supporting layer pattern 208*a* may include silicon nitride, the second mold layer 210 may include silicon oxide doped with impurities or silicon oxide non-doped impurities, because the silicon oxide may have an etching selectivity the silicon oxide regardless of doping of the impurities. Here, heights of the first preliminary mold layer pattern 204*a* and the second mold layer 210 may determine a height of a lower electrode 212. Thus, the height of the lower electrode 212 may be desirably adjusted by controlling the height of the second mold layer 210.

In some example embodiments, the second mold layer 210 may be formed on the planarized surfaces of the first preliminary mold layer pattern 204*a* and the preliminary supporting layer pattern 208*a*. Thus, because the second mold layer 210 may not be formed in a narrow gap, voids or seams may not be generated in the second mold layer 210, although the second mold layer 210 may have bad gap-filling characteristic.

Figure 7B:
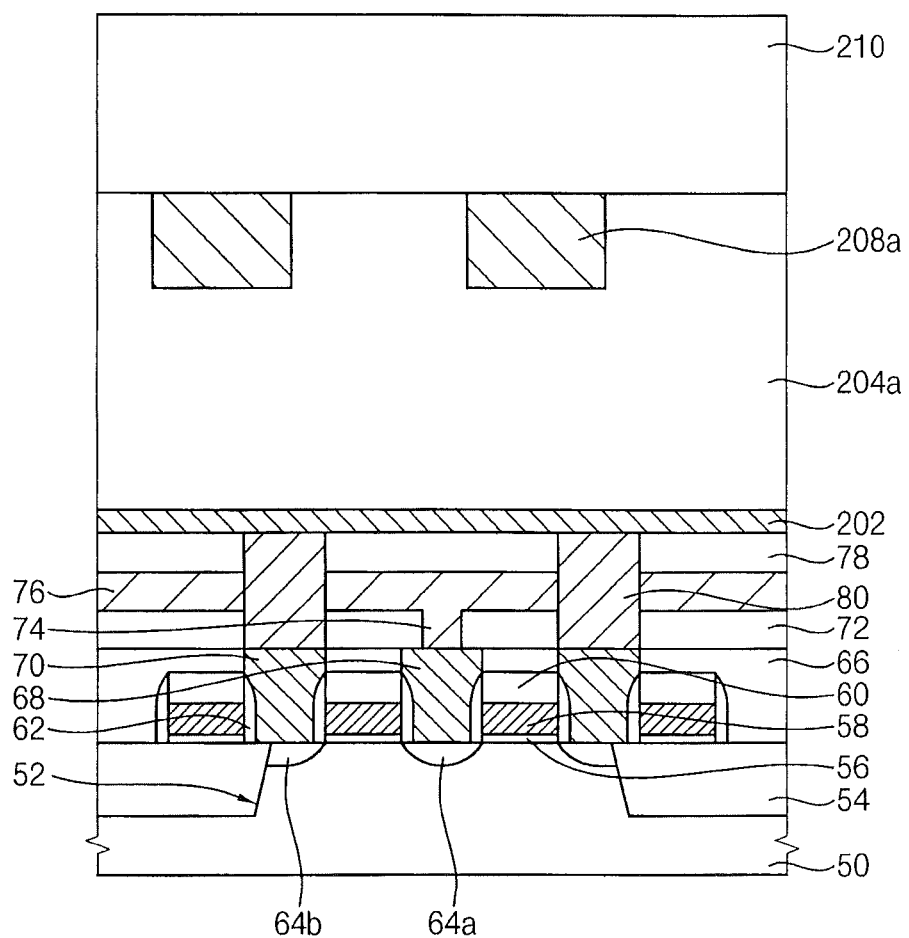
Figure 7C:
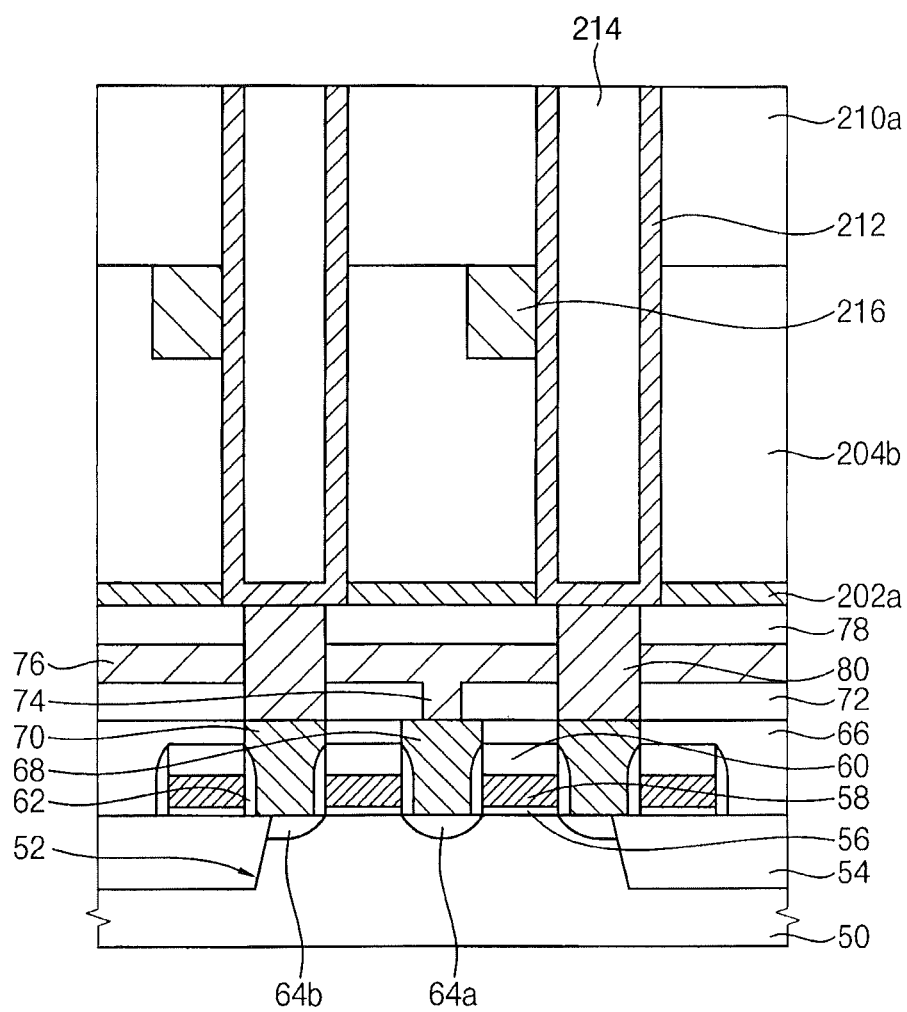

Referring to FIG. 7C, a mask pattern (not shown) may be formed on the first preliminary layer pattern 204*a* and the second mold layer 210. The second mold layer 210, the first preliminary mold layer pattern 204*a*, the preliminary supporting layer pattern 208*a* and the etch stop layer 202 may be anisotropically etched to form openings, thereby forming a second mold layer pattern 210*a* and a first mold layer pattern 204*b*. In some example embodiments, the opening may be partially formed through a sidewall of the preliminary supporting layer pattern 208*a*. Thus, the sidewall of the preliminary supporting layer pattern 208*a* may be partially etched to form a supporting layer pattern 216. The supporting layer pattern 216 may be exposed through a side surface of the opening. A conductive layer (not shown) may be formed on the side surface and the bottom surface of the opening and an upper surface of the second mold layer pattern 210*a*. A sacrificial layer (not shown) may be formed on the conductive layer to fill up the opening. In some example embodiments, the sacrificial layer may include a material having an etching selectivity with respect to the supporting layer pattern 216. The sacrificial layer may include a material having an etching selectivity substantially the same as or similar to the first preliminary mold layer pattern 204*a* and the second mold layer 210. The sacrificial layer and the conductive layer may be removed by a CMP process or an etch-back process until the upper surface of the second mold layer pattern 210*a* may be exposed to form the cylindrical lower electrode 212. Further, a sacrificial layer pattern 214 may be formed in the opening by the removal process.

Figure 7D:
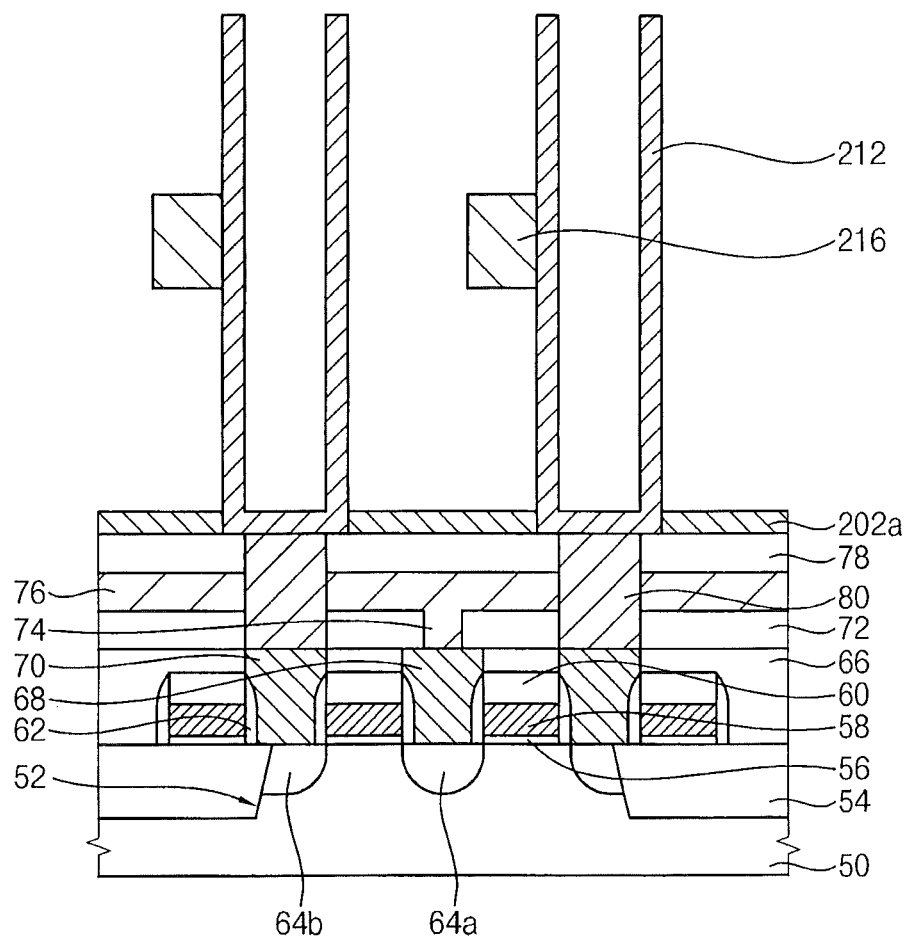

Referring to FIG. 7D, the first mold layer pattern 204*b*, the second mold layer pattern 210*a* and the sacrificial layer pattern 214 may be etched to expose an inner sidewall and an outer sidewall of the lower electrode 212. Here, the supporting layer pattern 216 may remain, not be removed. Thus, the supporting layer pattern 216 may make contact with the lower electrode 212. In some example embodiments, before removing the first mold layer pattern 204*b*, the second mold layer pattern 210*a* and the sacrificial layer pattern 214, upper surfaces of the first mold layer pattern 204*b*, the second mold layer pattern 210*a* and the sacrificial layer pattern 214 may be additionally treated. The surface treatment process may be substantially the same as that illustrated with reference to FIG. 1G.

In some example embodiments, when the supporting layer pattern 216 may include silicon nitride, the first mold layer pattern 204*b*, the second mold layer pattern 210*a* and the sacrificial layer pattern 214 may be removed using a BOE solution containing hydrogen fluoride (HF), ammonium hydrogen fluoride ($NH_4F$) and deionized water. In this condition, it may not be required to perform the surface treatment process.

Figure 7E:
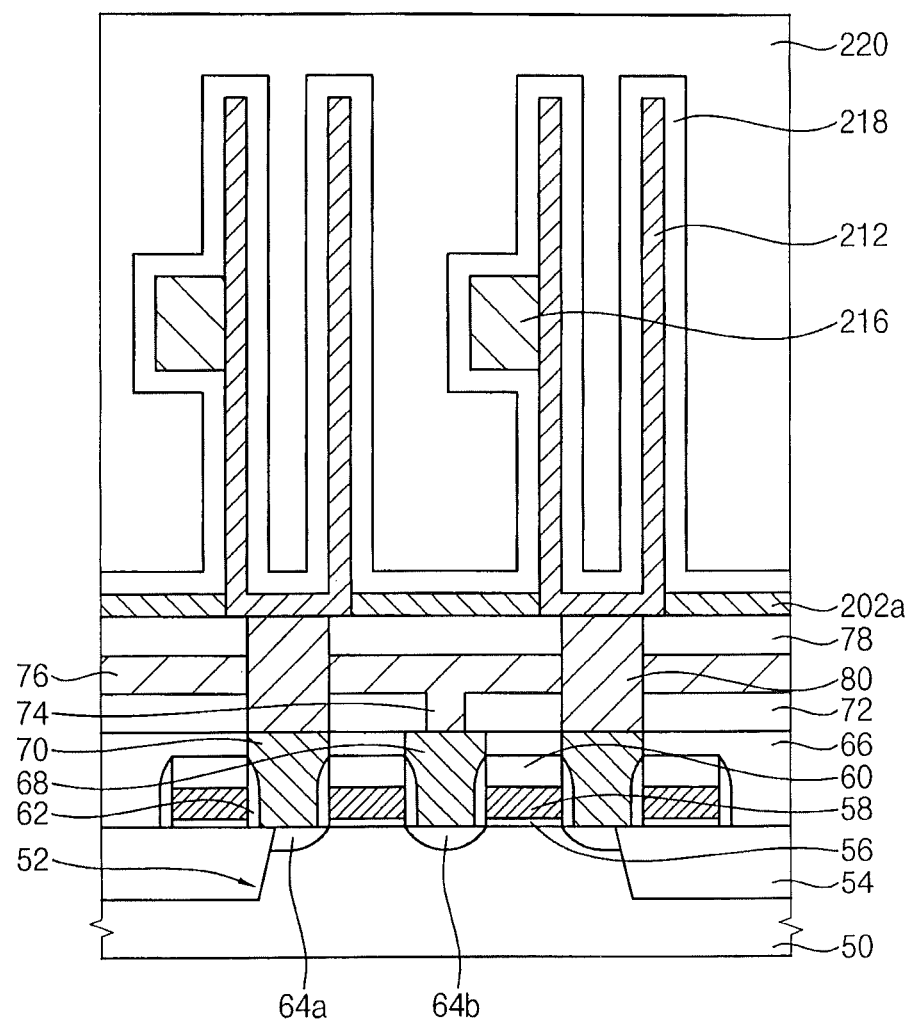

Referring to FIG. 7E, a dielectric layer 218 may be formed on the lower electrode 212 and the supporting layer pattern 216. An upper electrode 220 may be formed on the dielectric layer 218. In some example embodiments, various DRAM devices may be manufactured using the above-mentioned method of this example embodiment.

Figure 8A:
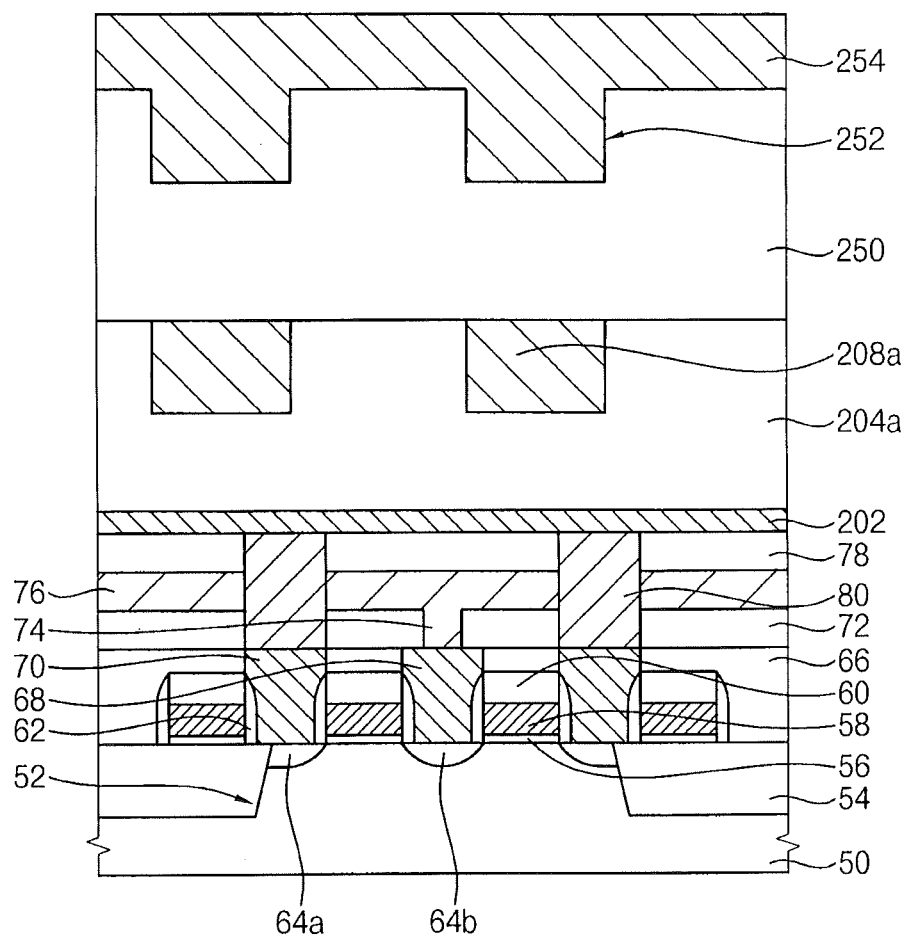
FIGS. 8A to 8D are cross-sectional views illustrating a method of manufacturing a DRAM device in accordance with some example embodiments of the invention.

FIGS. 8A to 8D are cross-sectional views illustrating a method of manufacturing a DRAM device in accordance with some example embodiments. Here, a capacitor of the DRAM device in accordance with this example embodiment may include a single lower electrode and at least two supporting layer patterns. Referring to FIG. 8A, processes substantially the same as those illustrated with reference to FIGS. 7A and 7B may be performed to form a structure substantially the same as that in FIG. 7B. A second mold layer (not shown) may be formed on the first preliminary mold layer pattern 204*a* and the preliminary supporting layer pattern 208*a*. The second mold layer may be etched to form a second preliminary mold layer pattern 250 having a second trench 252. A third mold layer 254 may be formed on the second preliminary mold layer pattern 250 to fill up the second trench 252.

In some example embodiments, the second mold layer may include a material having an etching selectivity with respect to the preliminary supporting layer pattern 208*a*. Further, the third mold layer 254 may include a material having an etching selectivity with respect to the second mold layer. Thus, the second mold layer may include silicon oxide doped with impurities. The third mold layer 254 may include silicon oxide non-doped with impurities. That is, the second mold layer may include a material substantially the same as that of the first mold layer pattern 204*a*. The third mold layer 254 may include a material substantially the same as that of the preliminary supporting layer pattern 208*a*. Alternatively, the preliminary supporting layer pattern 208*a* and the third mold layer 254 may include different materials. For example, any one of the preliminary supporting layer pattern 208*a* and the third mold layer 254 may include silicon nitride.

Figure 8B:
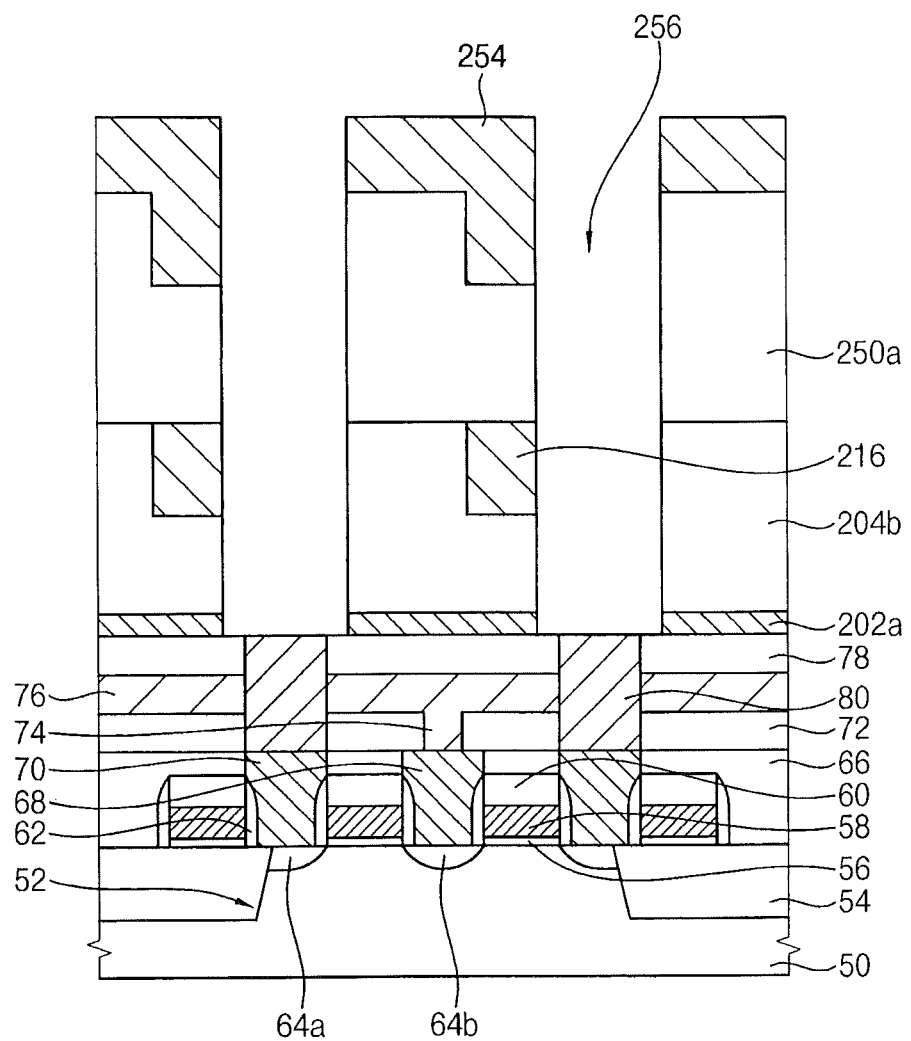

Referring to FIG. 8B, a mask pattern (not shown) may be formed on the third mold layer 254. The third mold layer 254, the preliminary second mold layer pattern 250, the first preliminary mold layer pattern 204*a*, the preliminary supporting layer pattern 208*a* and the etch stop layer 202 may be anisotropically etched to form an opening 256. In some example embodiments, the opening 256 may be partially formed through a sidewall of the preliminary supporting layer pattern 208*a*. Further, the opening 256 may be partially formed through the third mold layer 254 in the second trench 252. Thus, the sidewall of the preliminary supporting layer pattern 208*a* may be partially etched to form a first supporting layer pattern 216. The first preliminary mold layer pattern 204*a* and the second preliminary mold layer pattern 250 may be converted into a first mold layer pattern 204*b* and a second mold layer pattern 250*a*, respectively.

Figure 8C:
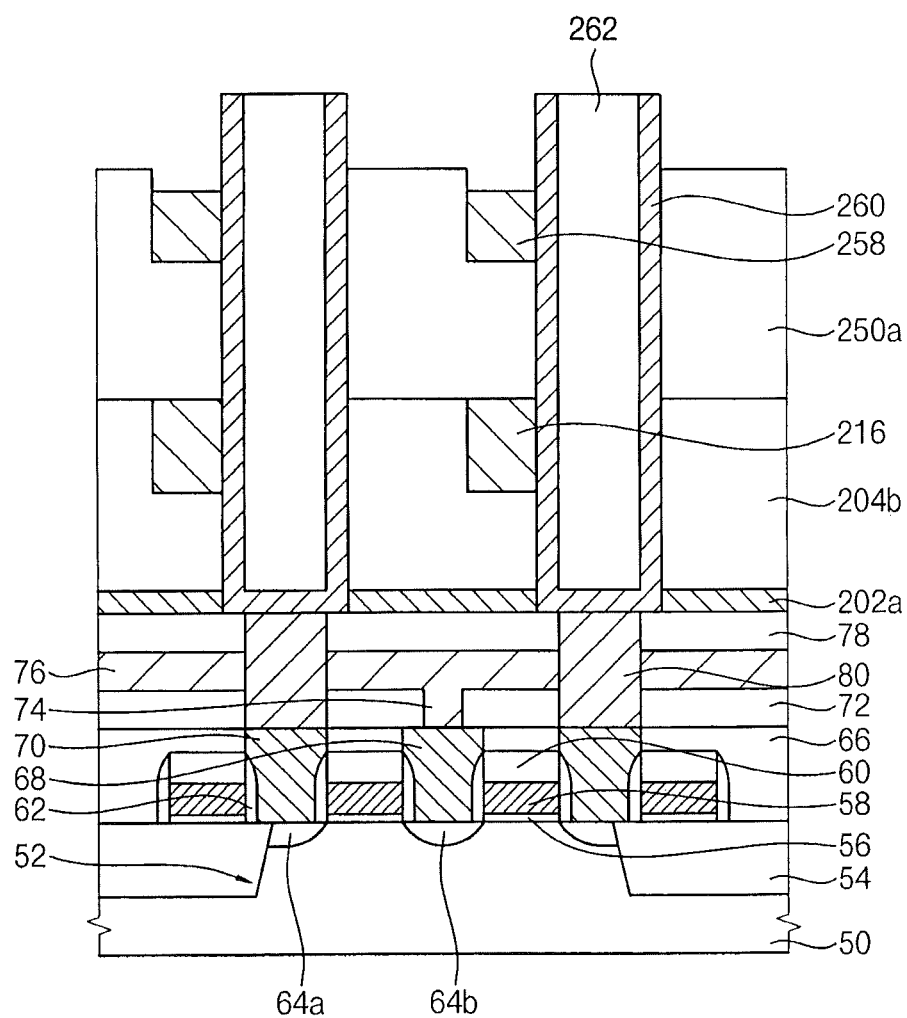

Referring to FIG. 8C, a conductive layer (not shown) may be formed on the side surface and the bottom surface of the opening 256 and an upper surface of the second mold layer pattern 250a. A sacrificial layer (not shown) may be formed on the conductive layer to fill up the opening 256. In some example embodiments, the sacrificial layer may include a material having an etching selectivity with respect to the first supporting layer pattern 216. The sacrificial layer may include a material having an etching selectivity substantially the same as or similar to the first to the third mold layers. The sacrificial layer and the conductive layer may be removed by a CMP process or an etch-back process until the upper surface of the second mold layer pattern 210a may be exposed to form the cylindrical lower electrode 260. Further, a sacrificial layer pattern 262 may be formed in the opening 256 by the removal process. The third mold layer 254 may be partially removed until an upper surface of the second mold layer pattern 250a may be exposed to form a second supporting layer pattern 258 in the second trench 252. The second supporting layer pattern 258 may support an upper sidewall of the lower electrode 260.

Figure 8D:
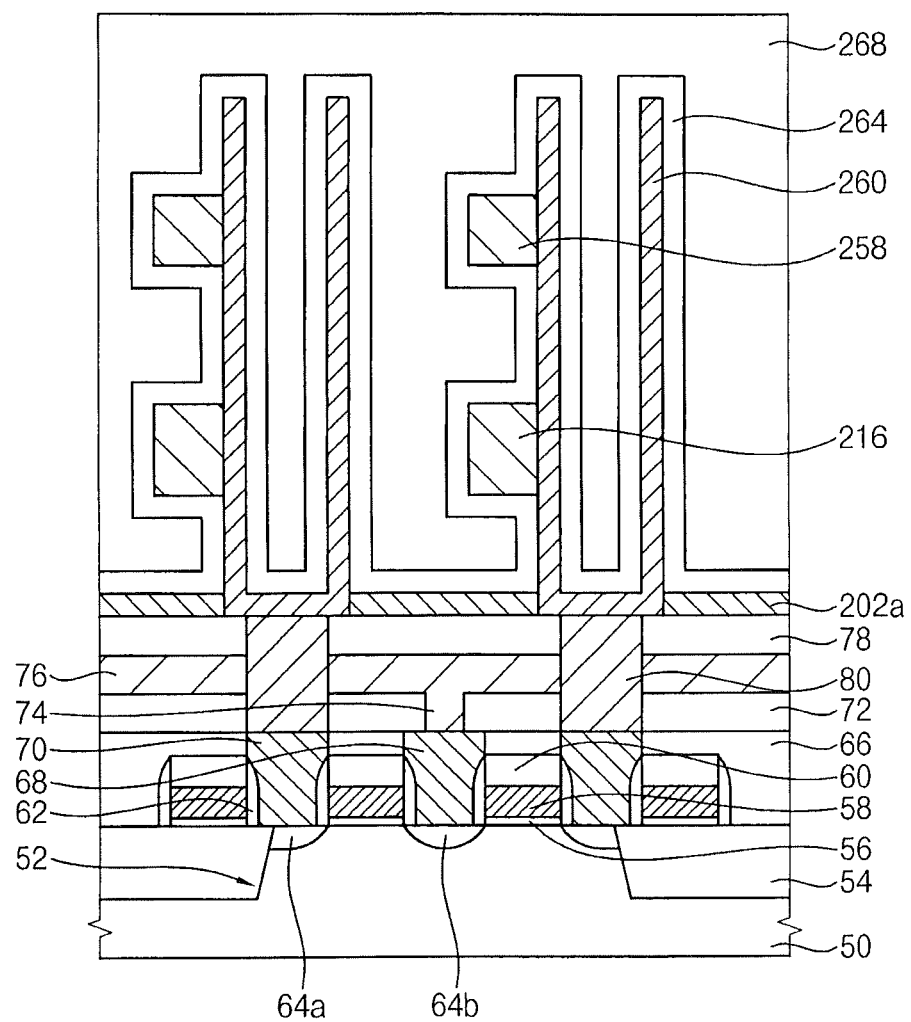

Referring to FIG. 8D, the first mold layer pattern 204b, the second mold layer pattern 250a and the sacrificial layer pattern 262 may be etched to expose an inner sidewall and an outer sidewall of the lower electrode 260. The first supporting layer pattern 216 may support a lower sidewall of the lower electrode 260. Thus, the first supporting layer pattern 216 and the second supporting layer pattern 258 may together support the lower electrode 260, so that the lower electrode 260 may have a stable structure. A dielectric layer 264 may be formed on the lower electrode 260, the first supporting layer pattern 216 and the second supporting layer pattern 258. An upper electrode 268 may be formed on the dielectric layer 264. In some example embodiments, various DRAM devices may be manufactured using the above-mentioned method of this example embodiment.

Figure 9A:
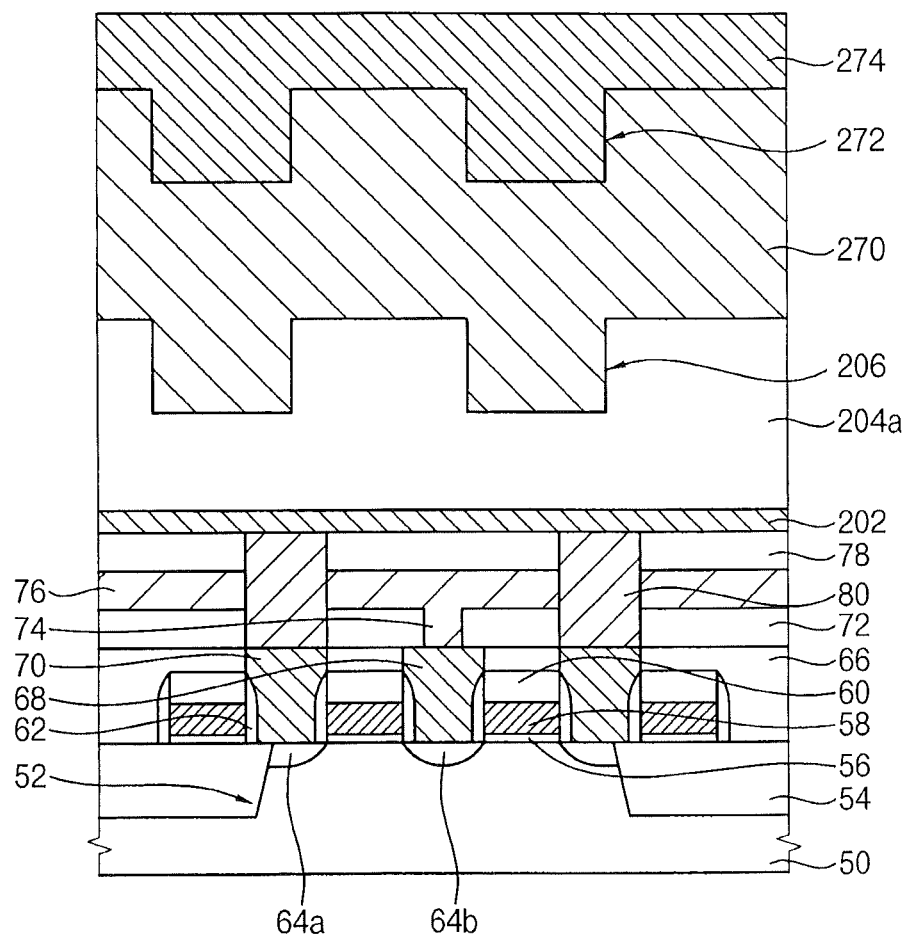
FIGS. 9A to 9C are cross-sectional views illustrating a method of manufacturing a DRAM device in accordance with some example embodiments of the invention.
Figure 9B:
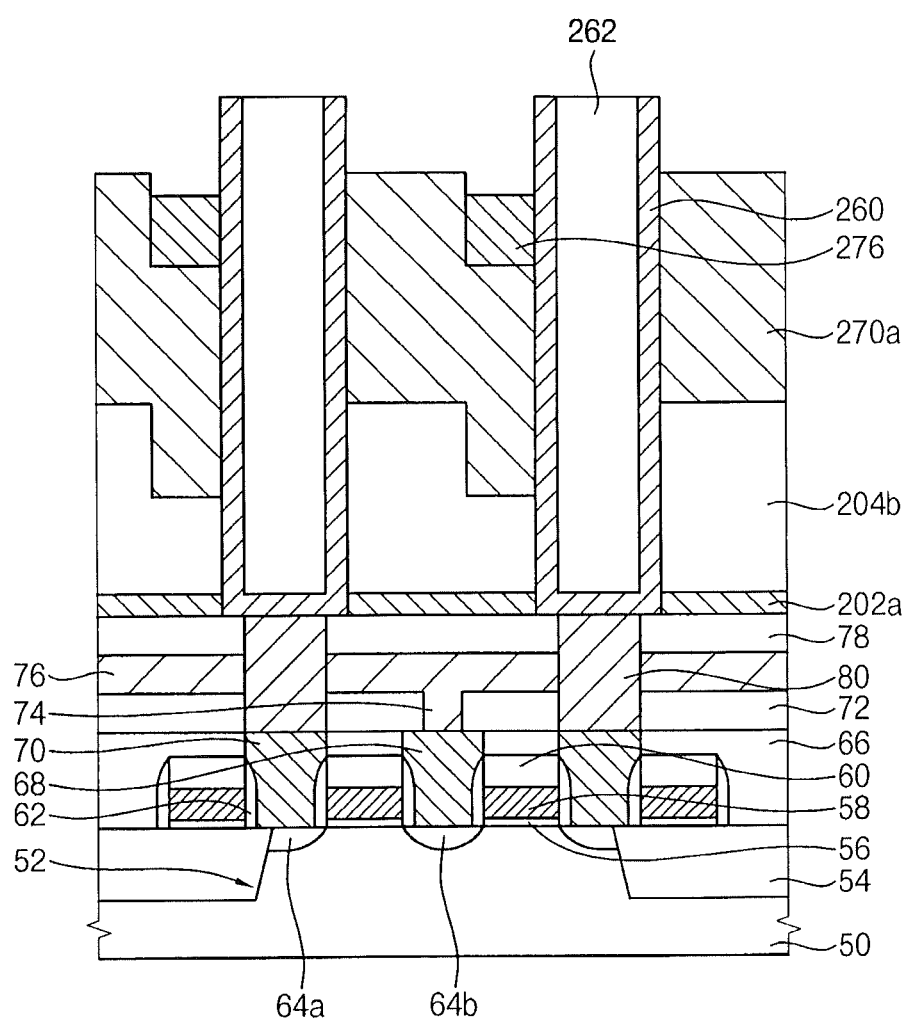
Figure 9C:
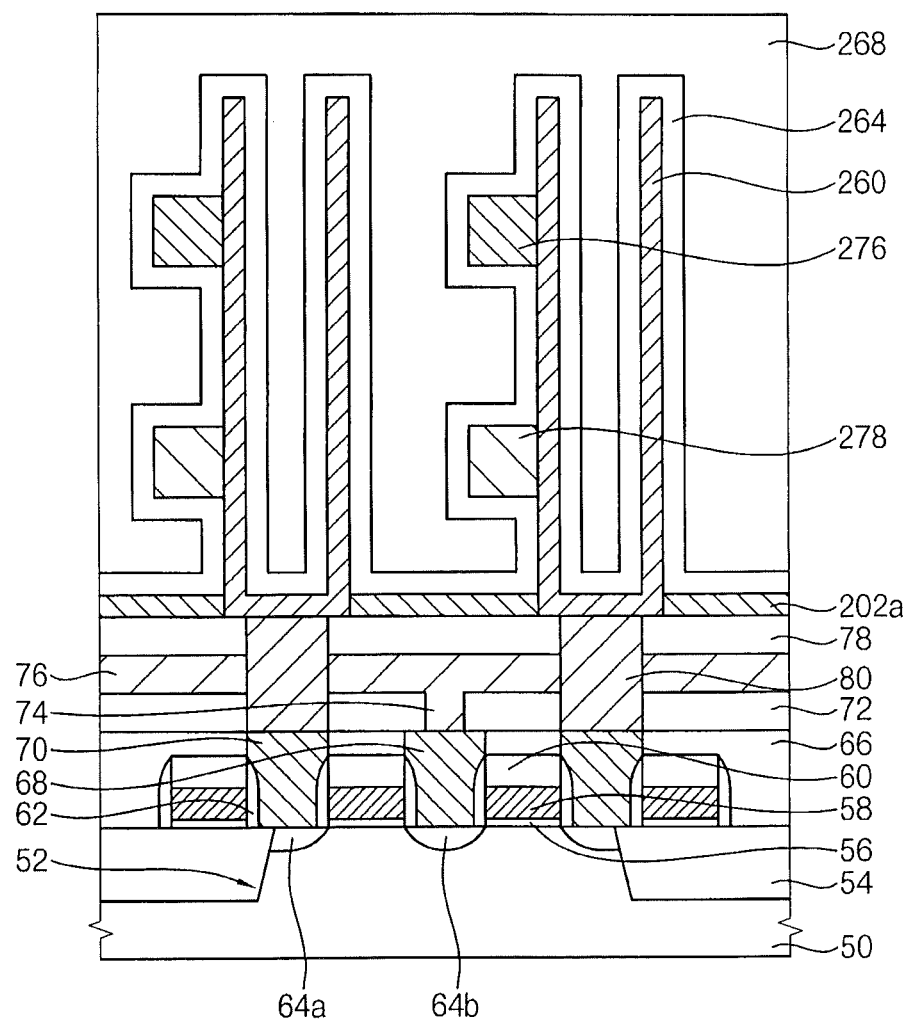

FIGS. 9A to 9C are cross-sectional views illustrating a method of manufacturing a DRAM device in accordance with some example embodiments. Referring to FIG. 9A, a lower structure may be formed on a semiconductor substrate 50. Processes substantially the same as those illustrated with reference to FIGS. 1A to 1C may be performed. In some example embodiments, the second mold layer may include silicon oxide non-doped impurities. The second mold layer may be etched to form a second preliminary mold layer pattern 270 having a second trench 272. In some example embodiments, the second trench 272 may have a shape substantially the same as that of the first trench 206. Alternatively, the second trench 272 may have a shape different from that of the first trench 206. A third mold layer 274 may be formed on the second preliminary mold layer pattern 270 to fill up the second trench 272. In some example embodiments, a portion of the third mold layer 274 may serve as a second supporting layer pattern. The third mold layer 274 may include a material having an etching selectivity with respect to the first preliminary mold layer pattern 204a and the second preliminary mold layer pattern 270. For example, the third mold layer 274 may include silicon nitride. Thus, the second mold layer may include silicon oxide doped with impurities. The third mold layer 254 may include silicon oxide non-doped with impurities. That is, the second mold layer may include a material substantially the same as that of the first mold layer pattern 204a. The third mold layer 254 may include a material substantially the same as that of the preliminary supporting layer pattern 208a.

Referring to FIG. 9B, the third mold layer 274, the preliminary second mold layer pattern 270, the first preliminary mold layer pattern 204a and the etch stop layer 202 may be anisotropically etched to form an opening, thereby forming a first mold layer pattern 204b, a second mold layer pattern 270a and a third mold layer pattern (not shown). A lower electrode 260 may be formed on inner surface of the opening. A sacrificial layer pattern 262 may be formed on the lower electrode 260 to fill up the opening. In some example embodiments, the lower electrode 260 and the sacrificial layer pattern 262 may be formed by processes substantially the same as those illustrated with reference to FIG. 1E. The third mold layer pattern may be etched until an upper surface of the second mold layer pattern 270a may be exposed to form a second supporting layer pattern 276 in the second trench 272. The second supporting layer pattern 276 may be formed by processes substantially the same as those illustrated with reference to FIG. 1F. The first mold layer pattern 204b may be removed by processes substantially the same as those illustrated with reference to FIG. 1G. A dielectric layer 264 and an upper electrode 268 may be sequentially formed on the lower electrode 260, the first supporting layer pattern 278 and the second supporting layer pattern 276.

Figure 10A:
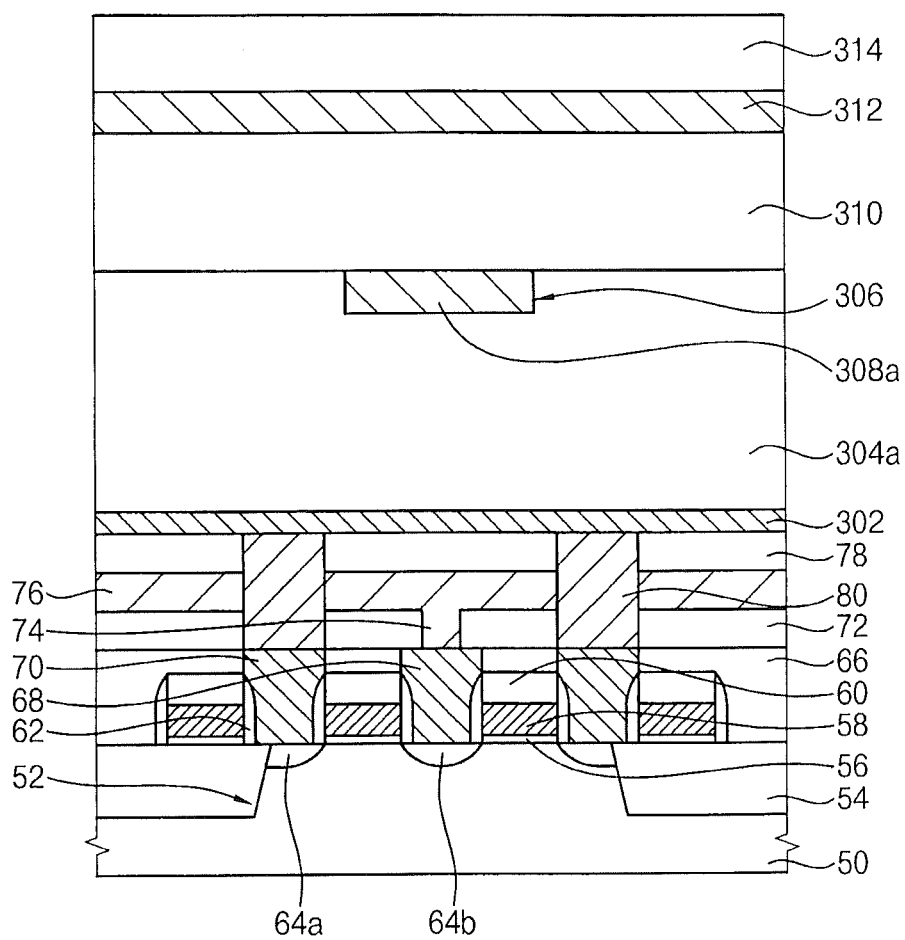
FIGS. 10A to 10D are cross-sectional views illustrating a method of manufacturing a DRAM device in accordance with some example embodiments of the invention.
Figure 10B:
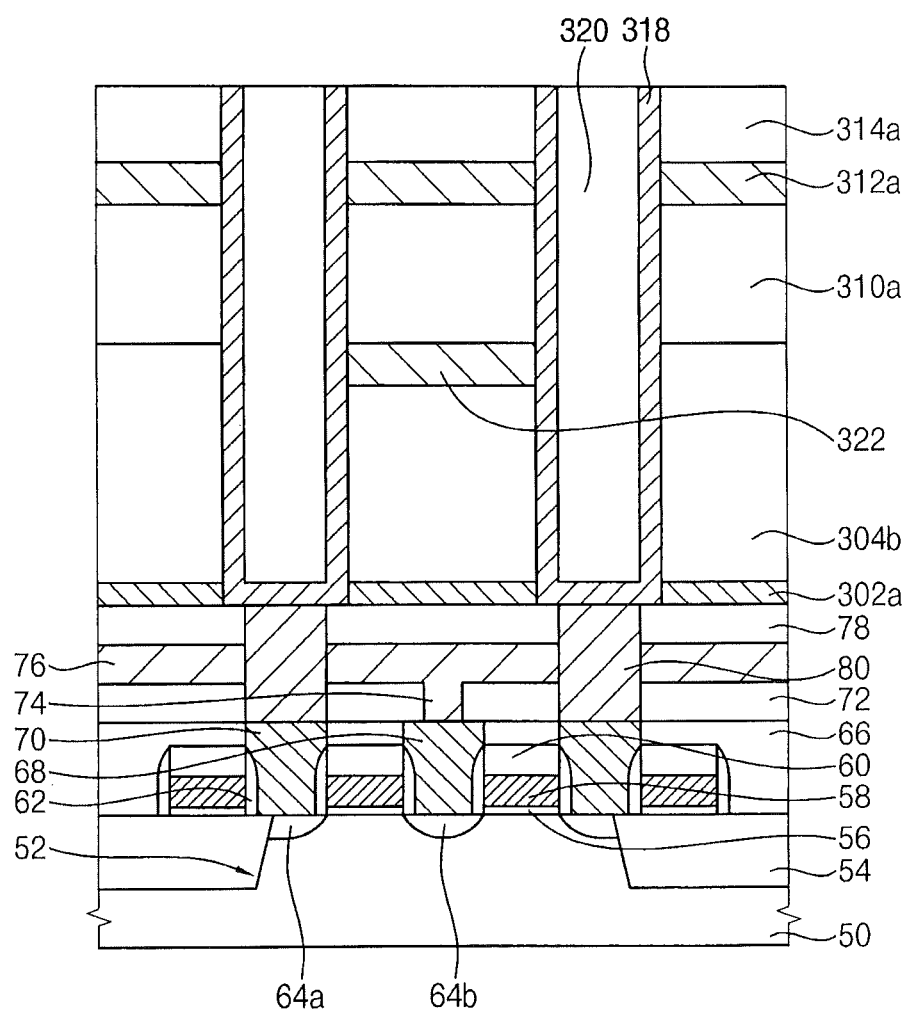
Figure 10C:
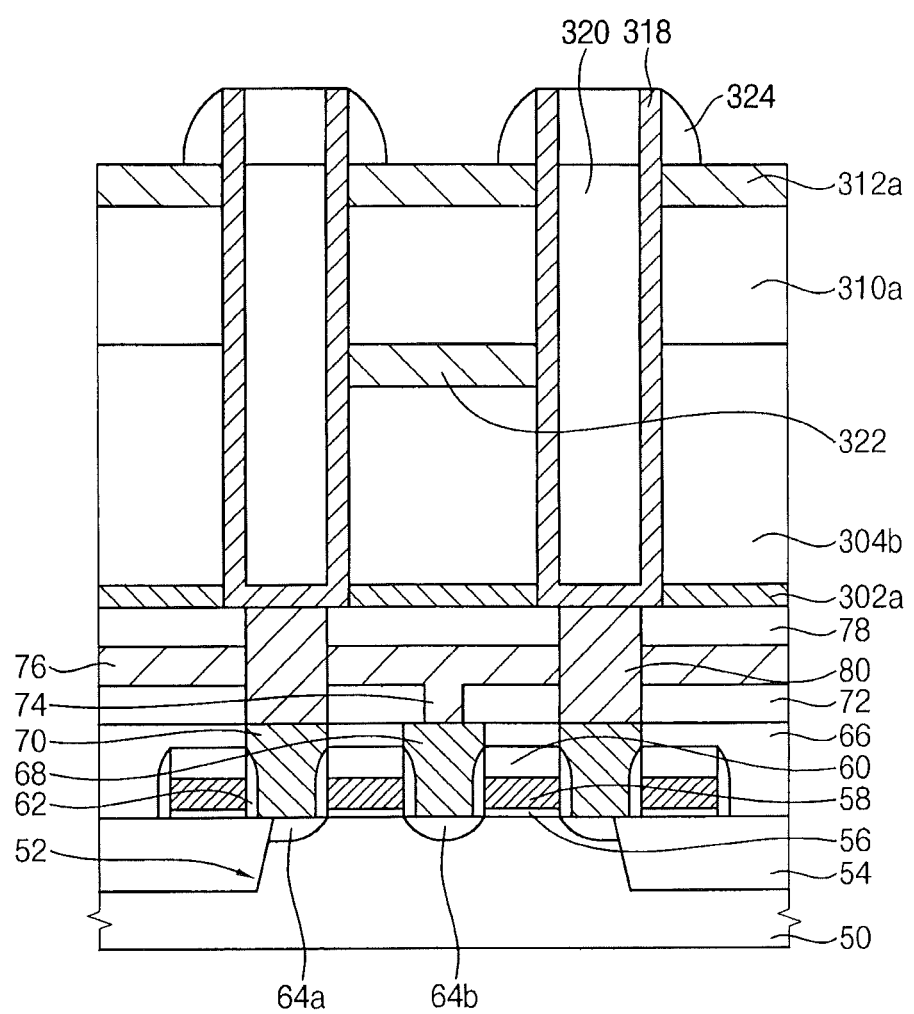
Figure 10D:
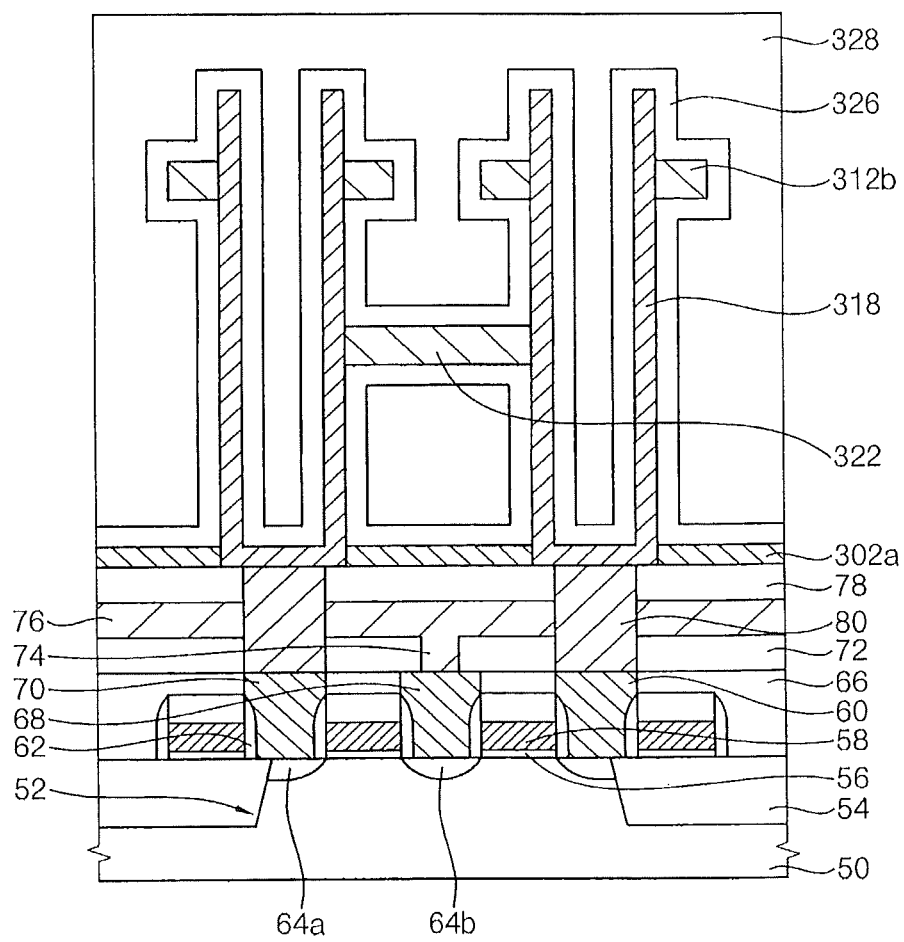
Figure 11A:
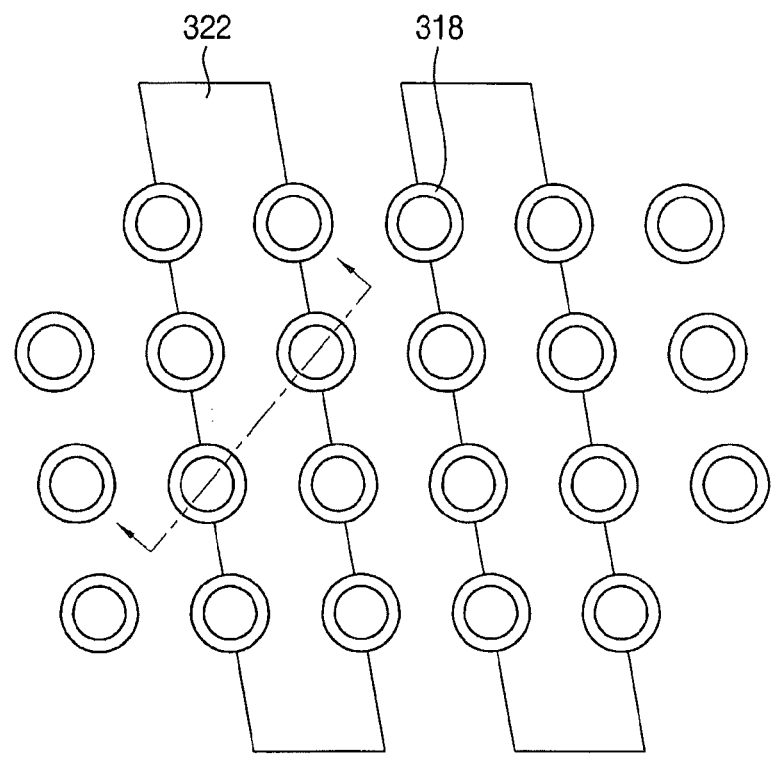
FIGS. 11A and 12A are plan views illustrating a first supporting layer pattern of the DRAM device in FIG. 10D.
Figure 11B:
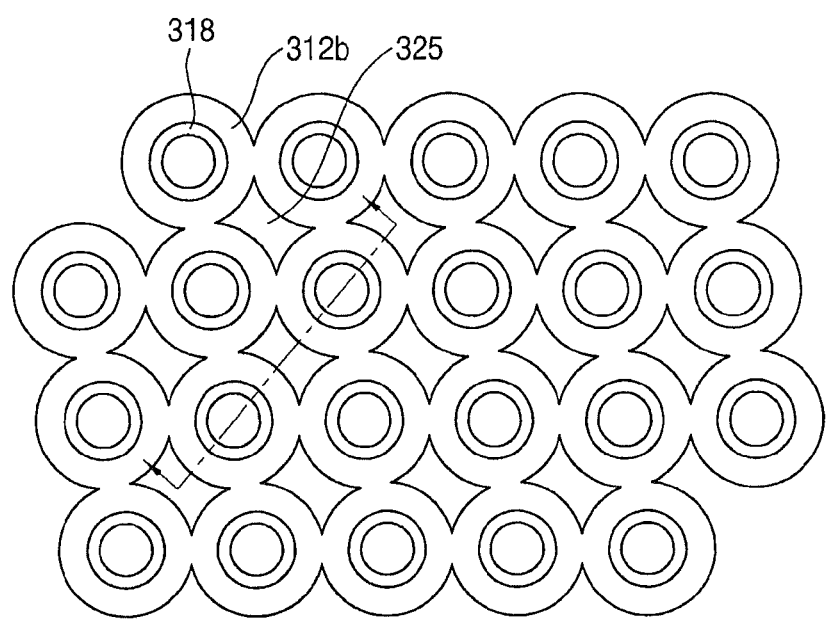
FIGS. 11B and 12B are plan views illustrating a second supporting layer pattern of the DRAM device in FIG. 10D.
Figure 12A:
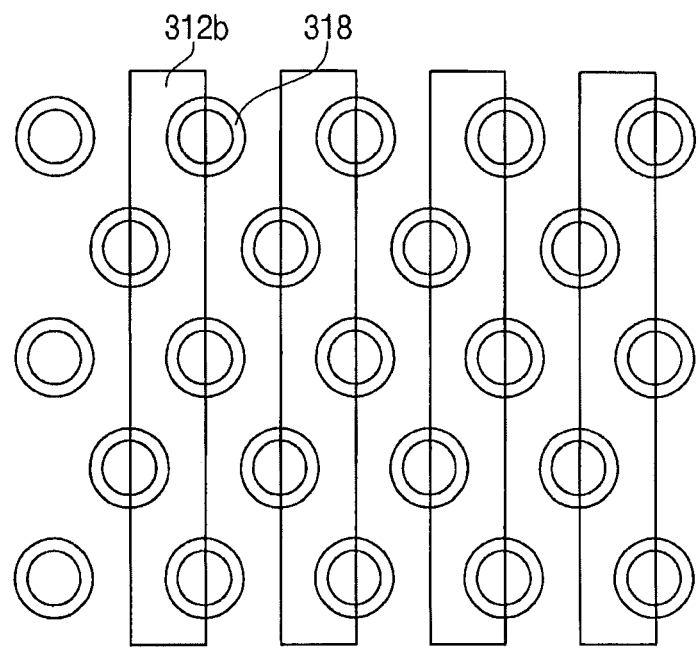
Figure 12B:
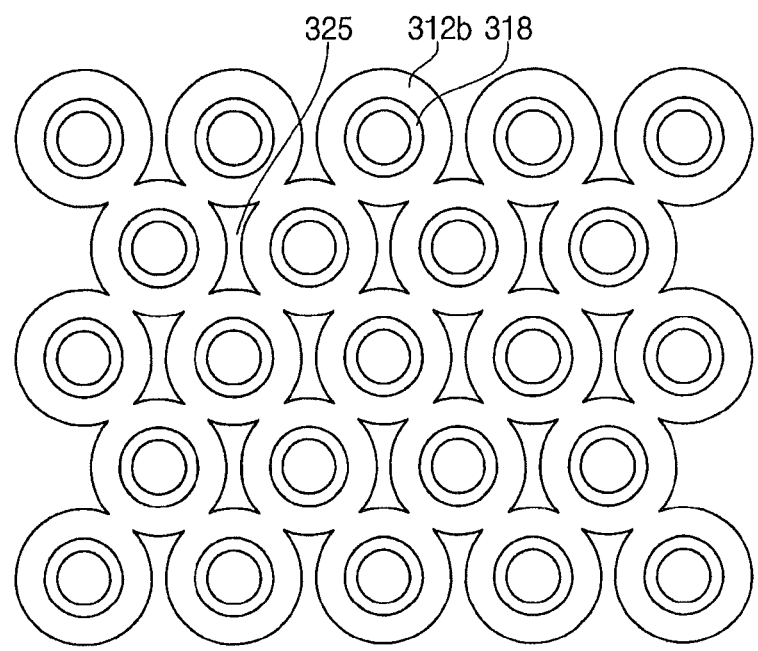

FIGS. 10A to 10D are cross-sectional views illustrating a method of manufacturing a DRAM device in accordance with some example embodiments, FIGS. 11A and 12A are plan views illustrating a first supporting layer pattern of the DRAM device in FIG. 10D, and FIGS. 11B and 12B are plan views illustrating a second supporting layer pattern of the DRAM device in FIG. 10D.

Referring to FIG. 10A, processes substantially the same as those illustrated with reference to FIGS. 7A and 7B may be performed to form a structure substantially the same as that in FIG. 7B. In some example embodiments, the second mold layer 310 may include silicon oxide doped impurities. The second mold layer 310 may include a material substantially the same as that of the first mold layer 304a. A second supporting layer 312 may be formed on the second mold layer 310. In some example embodiments, the second supporting layer 312 may be converted into a second supporting layer pattern by following processes. The second supporting layer 312 may include a material having an etching selectivity with respect to the first mold layer 304a and the second mold layer 310. Further, the second supporting layer 312 may include a material substantially the same as that of the preliminary supporting layer pattern 308a. Alternatively, the second supporting layer 312 may include a material different from that of the preliminary supporting layer pattern 308a. For example, the second supporting layer 312 may include silicon oxide non-doped with impurities. Alternatively, the second supporting layer 312 may include silicon nitride.

A third mold layer 314 may be formed on the second supporting layer 312. In some example embodiments, the third mold layer 314 may include a material having an etching selectivity with respect to the second mold layer 312. For example, the third mold layer 314 may include a material substantially the same as that of the second mold layer 310. Alternatively, in order to simplify the method of this example embodiment, forming the third mold layer 314 may be omitted by forming the second supporting layer 312 having a thick thickness. In this case, it may be required to etch the second supporting layer 312 to reduce a thickness of the second supporting layer 312 after forming a lower electrode. Referring to FIG. 10B, the third mold layer 314, the second supporting layer 312, the second mold layer 310, the preliminary supporting layer pattern 308a, the first mold layer 304a and the etch stop layer 302 may be anisotropically etched to form an opening, thereby forming a first mold layer pattern 304b, a second mold layer pattern 310a, a third mold layer pattern 314a, a second preliminary supporting layer pattern 312a, a first supporting layer pattern 322 and an etch stop layer pattern 302a. In some example embodiments, the first supporting layer pattern 322 may have a shape varying in accordance with arrangements of the lower electrode 318. For example, the first supporting layer pattern 322 may have a linear shape extending in a slant direction in FIG. 11A. Alternatively, the first supporting layer pattern 322 may have a linear shape extending in a vertical direction in FIG. 12A. A lower electrode 318 may be formed on inner surfaces of the opening. A sacrificial layer pattern 320 may be formed in the opening. In some example embodiments, the lower electrode 318 and the sacrificial layer pattern 320 may be formed by processes substantially the same as those illustrated with reference to FIG. 1E.

Referring to FIG. 10C, the third mold layer pattern 314a may be etched until an upper surface of the second preliminary mold layer pattern 312a may be exposed. In some example embodiments, the sacrificial layer pattern 320 may remain or be partially removed. The second preliminary supporting mold layer pattern 312a may be exposed through a gap between the lower electrodes 318. A mask layer (not shown) may be formed on the second preliminary supporting layer pattern 312a and the lower electrode 318. In some example embodiments, the mask layer may include a material having an etching selectivity with respect to the second preliminary supporting layer pattern 312a. For example, the mask layer may include silicon oxide formed by an ALD process. In some example embodiments, the mask layer may fill a narrow gap between the lower electrodes 318. In contrast, the mask layer may cover the second preliminary supporting layer pattern 312a in a wide gap between the lower electrodes 318. The mask layer may be anisotropically etched to form a mask pattern 324. Here, the mask layer in the narrow gap between the lower electrodes 318 may be entirely removed. Thus, the mask pattern 324 may be configured to fill the narrow gap between the lower electrodes 318. The mask layer on the second preliminary supporting layer pattern 312a in the wide gap between the lower electrodes 318 may be entirely removed. Thus, the mask pattern 324 may remain an exposed sidewall of the lower electrode 318.

Referring to FIG. 10D, the second preliminary supporting layer pattern 312a may be etched using the mask pattern 324 as an etch mask to form a second supporting layer pattern 312b. In some example embodiments, the second supporting layer pattern 312b may have a meshed shape. Alternatively, the second supporting layer pattern 312b may have a shape varying in accordance with arrangements of the lower electrode 318.

The second mold layer pattern 310a and the first mold layer pattern 304b may be removed. In some example embodiments, the sacrificial layer pattern 320 and the mask pattern may be removed simultaneously with the second mold layer pattern 310a and the first mold layer pattern 304b. Alternatively, the sacrificial layer pattern 320 may be removed by a separate process. The first supporting layer pattern 322 may be connected between central sidewalls of the adjacent lower electrodes 318. A dielectric layer 326 and an upper electrode 328 may be sequentially formed on the lower electrode 318, the first supporting layer pattern 322 and the second supporting layer pattern 312b, to complete the capacitor including the single lower electrode 318 and the two supporting layer patterns 322 and 312b.

Figure 13A:
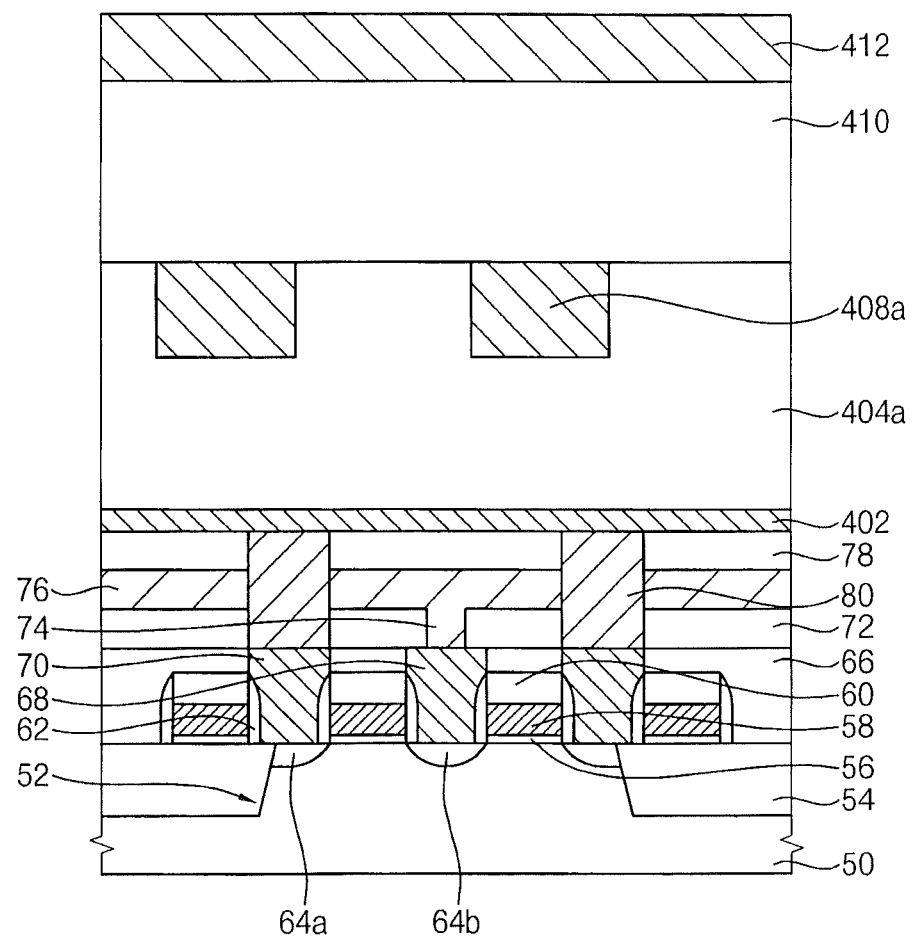
FIGS. 13A to 13C are cross-sectional views illustrating a method of manufacturing a DRAM device in accordance with some example embodiments of the invention.
Figure 13B:
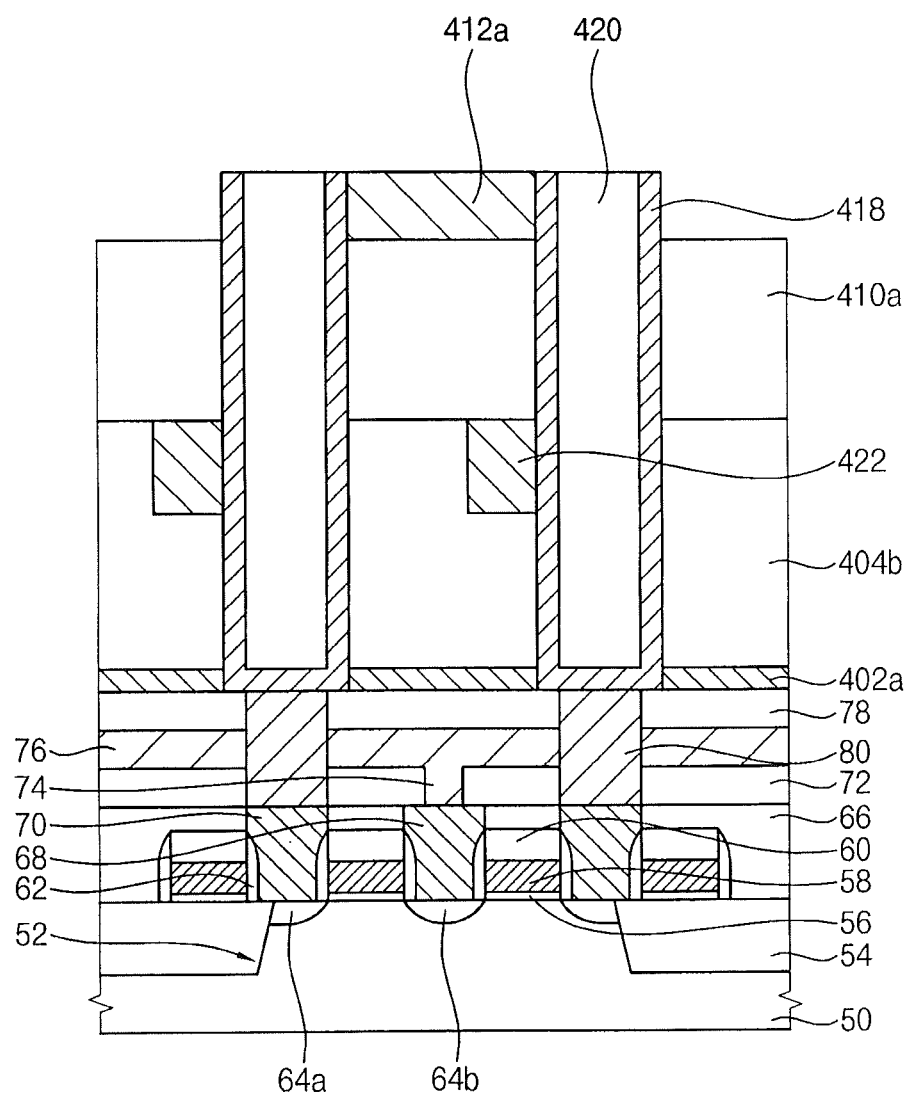
Figure 13C:
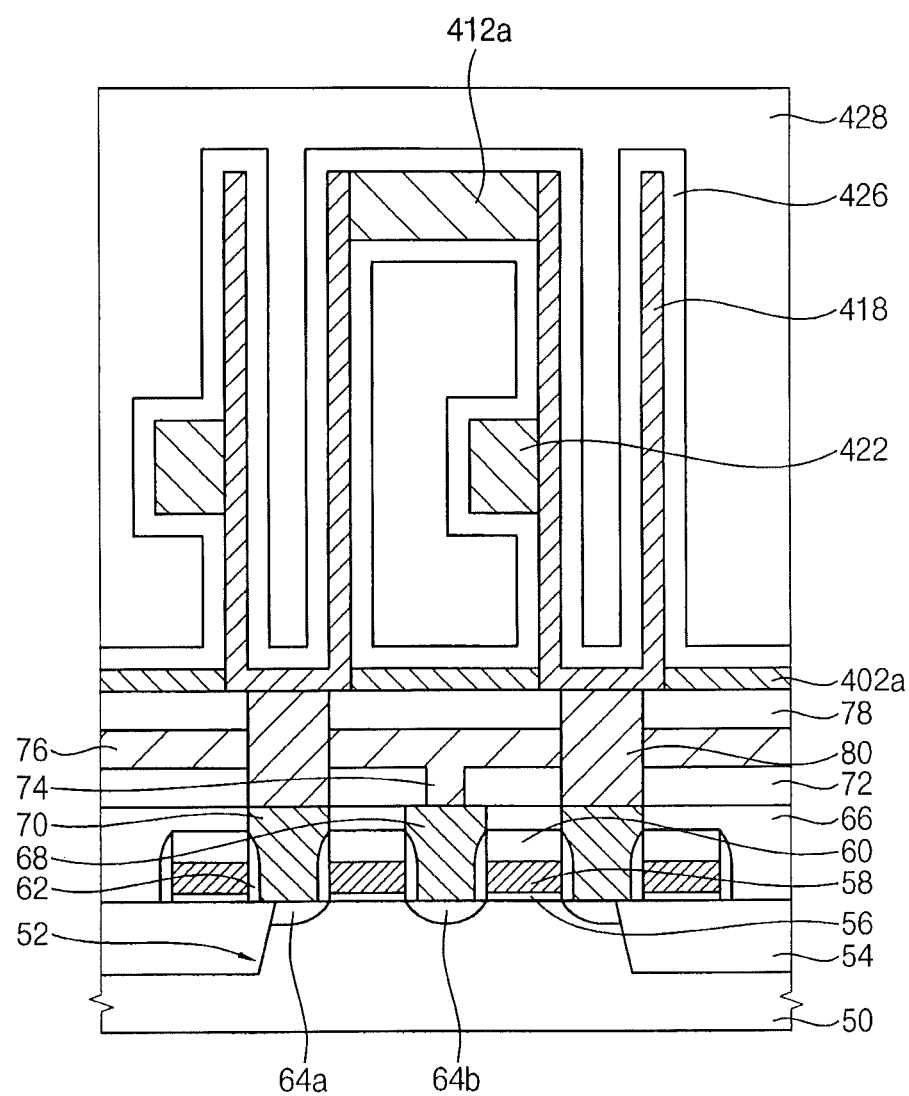

FIGS. 13A to 13C are cross-sectional views illustrating a method of manufacturing a DRAM device in accordance with some example embodiments. Processes substantially the same as those illustrated with reference to FIGS. 7A and 7B may performed to form a structure substantially the same as that in FIG. 7B.

Referring to FIG. 13A, a second mold layer 410 and a second supporting layer 412 may be formed on the first preliminary mold layer pattern 404a. In some example embodiments, the second supporting layer 412 may include silicon oxide non-doped impurities. The second supporting layer 412 may include a material substantially the same as that of the first supporting layer. Alternatively, the second supporting layer 412 may include a material different from that of the first supporting layer. In some example embodiments, the second supporting layer 412 may include silicon nitride. When the second supporting layer 412 may include the silicon nitride, the second mold layer may include silicon oxide doped with impurities or silicon oxide non-doped impurities.

Referring to FIG. 13B, the second supporting layer pattern 412, the second mold layer 410, the preliminary supporting layer pattern 408a, the first preliminary mold layer pattern 404a and the etch stop layer 402 may be etched to form an opening, thereby forming a second preliminary supporting layer pattern, a second mold layer pattern 410a, a first supporting layer pattern 422, a first mold layer pattern 404b and an etch stop layer pattern 402a. A cylindrical lower electrode 418 may be formed on a side surface and a bottom surface of the opening. A sacrificial layer pattern 420 may be formed on the lower electrode 418 to fill up the opening. In some example embodiments, the lower electrode 418 and the sacrificial layer pattern 420 may be formed by processes substantially the same as that illustrated with reference to FIG. 1E. A mask pattern (not shown) may be formed on the second preliminary supporting layer pattern, the lower electrode 418 and the sacrificial layer pattern 420. The second preliminary supporting layer pattern 412a may be etched using the mask pattern as an etch mask to form a second supporting layer pattern 412a configured to support an upper sidewall of the lower electrode 418.

Referring to FIG. 13C, the first mold layer pattern 404b and the second mold layer pattern 410a may be etched. Here, the first supporting layer pattern 422 and the second supporting layer pattern 412a may remain. In some example embodiments, the first mold layer pattern 404b and the second mold layer pattern 410a may be removed by processes substantially the same as those illustrated with reference to FIG. 1G. A dielectric layer 426 and an upper electrode 428 may be sequentially formed on the lower electrode 418, the first supporting layer pattern 422 and the second supporting layer pattern 412a. According to this example embodiment, the capacitor, which may include the first supporting layer pattern configured to the central sidewall of the lower electrode and the second supporting layer pattern configured to the upper sidewall of the lower electrode, may be manufactured. Further, the first supporting layer pattern and the second supporting layer pattern may have different plan shapes.

Figure 14A:
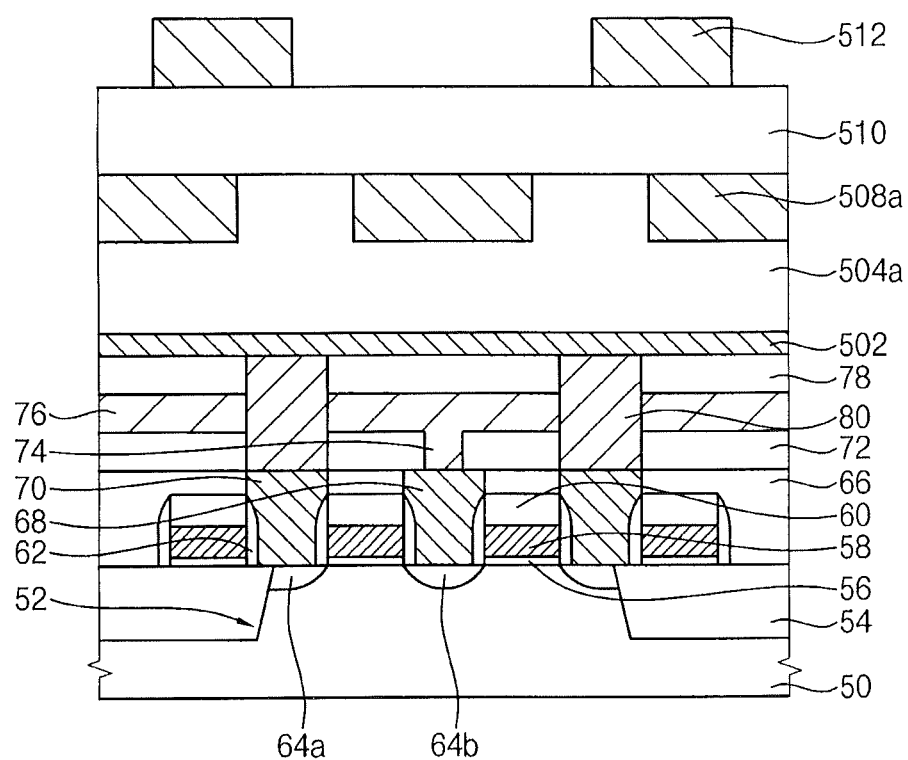
FIGS. 14A to 14C are cross-sectional views illustrating a method of manufacturing a DRAM device in accordance with some example embodiments of the invention.
Figure 14B:
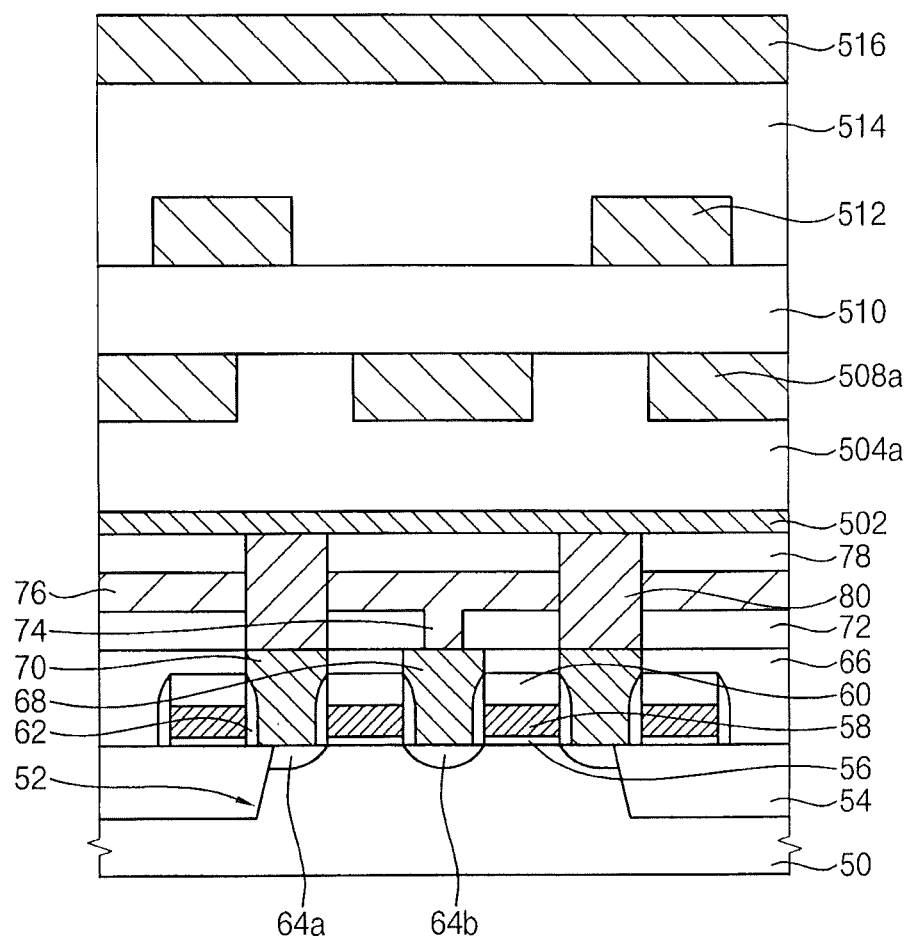
Figure 14C:
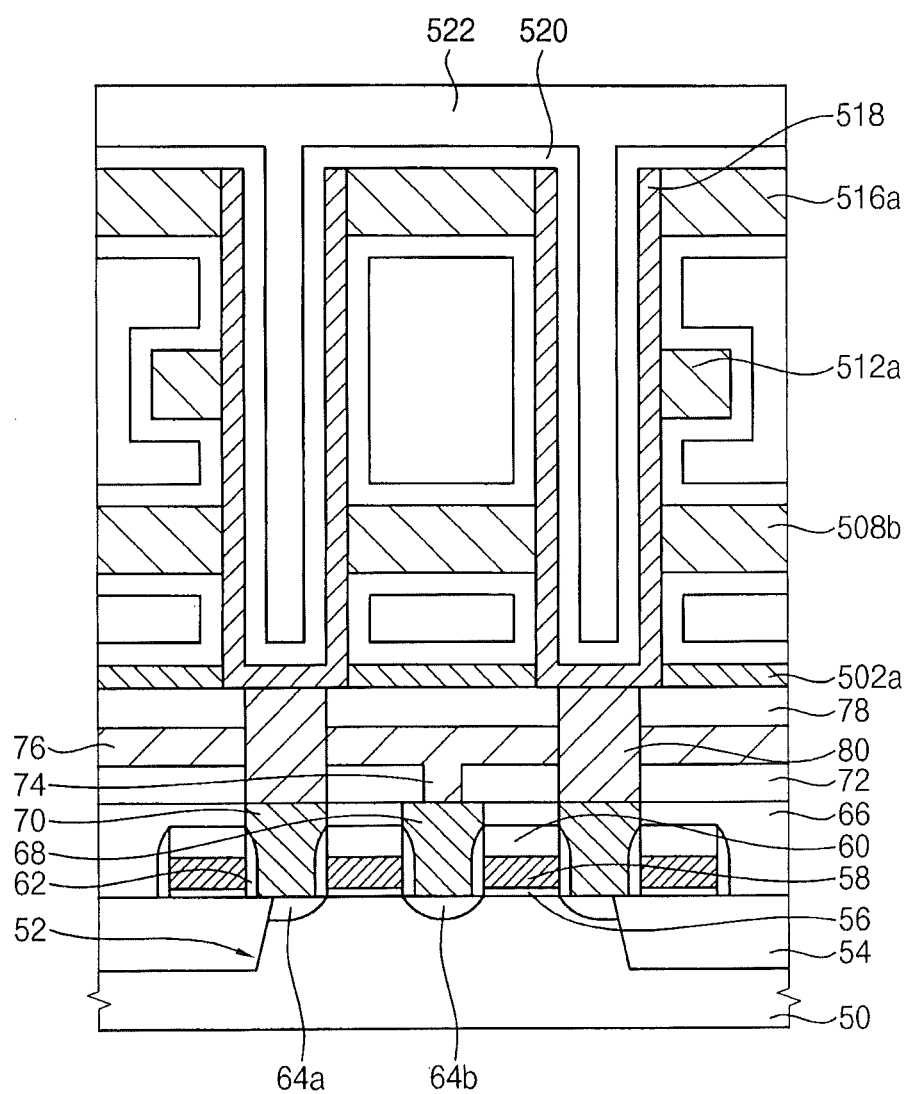

FIGS. 14A to 14C are cross-sectional views illustrating a method of manufacturing a DRAM device in accordance with some example embodiments. Here, a capacitor of the DRAM device in accordance with this example embodiment may include three supporting layer patterns on a sidewall of a lower electrode. Processes substantially the same as those illustrated with reference to FIGS. 7A and 7B may performed to form a structure substantially the same as that in FIG. 7B.

Referring to FIG. 14A, a second mold layer 510 may be formed on the first preliminary mold layer pattern 504a and the first preliminary supporting layer pattern 508a. In some example embodiments, when the first preliminary supporting layer pattern 508a may include silicon oxide non-doped impurities, the second mold layer 510 may include silicon oxide doped with impurities. That is, the second mold layer 510 may include a material substantially the same as that of the first mold layer pattern. Alternatively, the first preliminary supporting layer pattern 508a may include silicon nitride. A second supporting layer (not shown) may be formed on the second mold layer 510. In some example embodiments, the second supporting layer may include silicon oxide non-doped impurities or silicon nitride. The second supporting layer may be patterned to form a second preliminary supporting layer pattern 512.

Referring to FIG. 14B, a third mold layer 514 may be formed on the second mold layer 510 and the second supporting layer pattern 512. In some example embodiments, the third mold layer 514 may include a material without an etching selectivity with respect to the first preliminary mold layer pattern 504a and the second mold layer 510. For example, the third mold layer 514 may include a material substantially the same as that of the first preliminary mold layer pattern 504a and the second mold layer 510. A third supporting layer 516 may be formed on the third mold layer 514. In some example embodiments, the third supporting layer 516 may include silicon oxide doped with impurities or silicon nitride.

Referring to FIG. 14C, the third supporting layer 516, the second mold layer 510, the first preliminary mold layer pattern 504a and the etch stop layer 502 may be etched to form an opening. The third supporting layer 516, the second supporting layer pattern 512a and the first supporting layer pattern 508b may be exposed through a side surface of the opening. A lower electrode 518 may be formed on the side surface of the opening. A sacrificial layer pattern (not shown) may be formed on the lower electrode 518 to fill up the opening. The third supporting layer 516 may be patterned to form a third supporting layer pattern 516a. The first preliminary mold layer pattern 504a, the second mold layer 510 and the third mold layer 514 may be removed. The sacrificial layer pattern may then be removed. In some example embodiments, the first preliminary mold layer pattern 504a, the second mold layer 510 and the third mold layer 514 may be removed by processes substantially the same as those illustrated with reference to FIG. 1G. Here, the first supporting layer pattern 522, the second supporting layer pattern 512a and the third supporting layer pattern 516a may remain after removing the first preliminary mold layer pattern 504a, the second mold layer 510 and the third mold layer 514. In some example embodiments, when the first supporting layer pattern 508b, the second supporting layer pattern 512a and the third supporting layer pattern 516a may include silicon nitride, the first preliminary mold layer pattern 504a, the second mold layer 510 and the third mold layer 514 may be removed using a BOE solution containing hydrogen fluoride (HF), ammonium hydrogen fluoride ($NH_4F$) and deionized water. A dielectric layer 520 and an upper electrode 522 may be sequentially formed on the lower electrode 518, the first supporting layer pattern 508b, the second supporting layer pattern 512a and the third supporting layer pattern 516a.

Figure 15A:
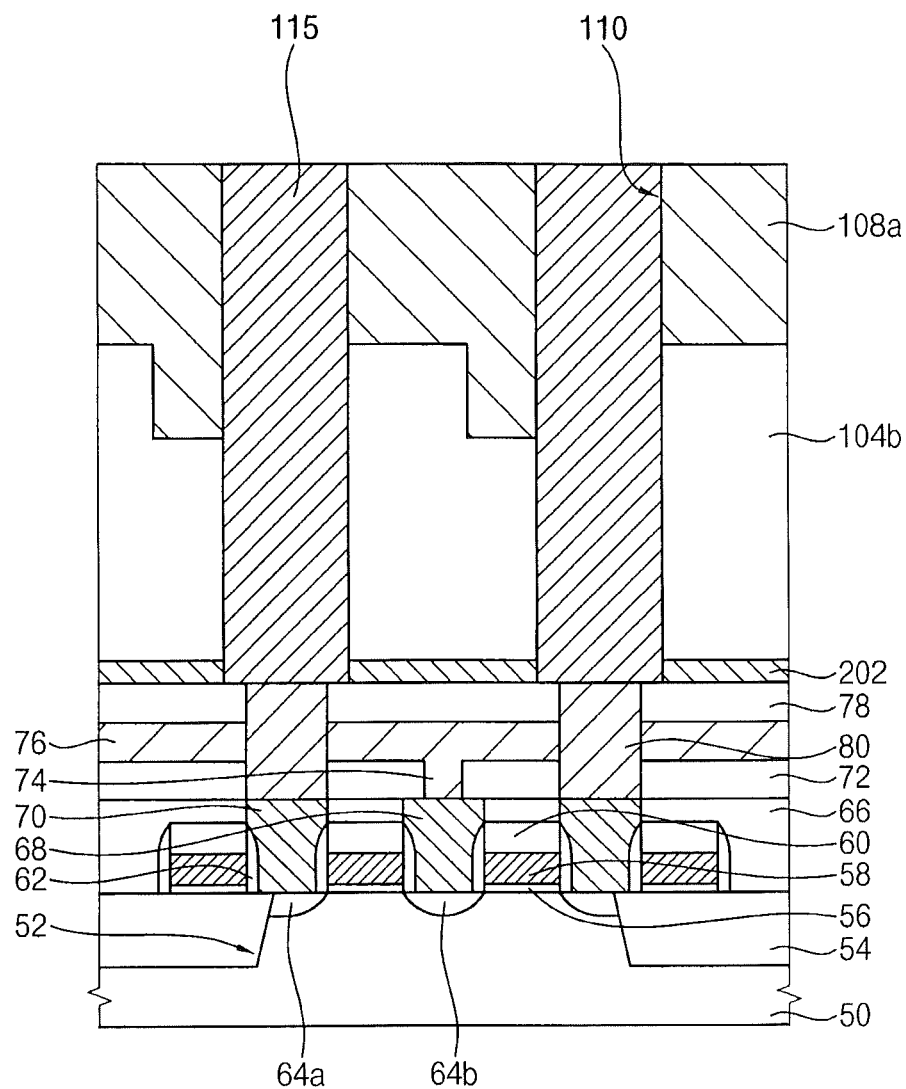
FIGS. 15A and 15B are cross-sectional views illustrating a method of manufacturing a DRAM device in accordance with some example embodiments of the invention.
Figure 15B:
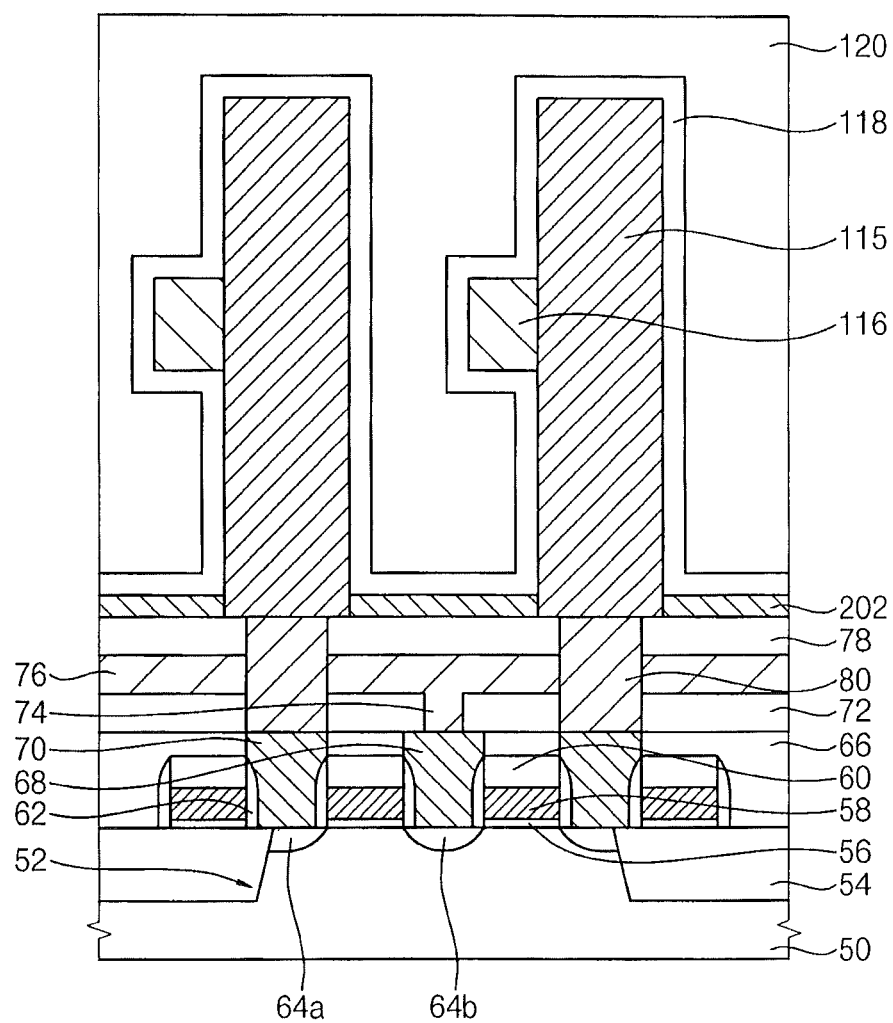

FIGS. 15A and 15B are cross-sectional views illustrating a method of manufacturing a DRAM device in accordance with some example embodiments. A capacitor of the DRAM device in accordance this example embodiment may be substantially the same as that in FIG. 1H except that a lower electrode may have a pillar shape. A lower structure may be formed on a semiconductor substrate 50. Processes substantially the same as those illustrated with reference to FIGS. 1A to 1D may be performed.

Referring to FIG. 15A, the opening 110 may be filled with a conductive layer (not shown). In some example embodiments, the conductive layer may include polysilicon, metal, metal nitride, etc. The conductive layer may be formed by a CVD process. The conductive layer may be planarized until an upper surface of the second mold layer pattern 108a may be exposed to form a lower electrode 115 having a pillar shape. In some example embodiment, because the opening 110 may be filled with the lower electrode 115, it may not be required to form a sacrificial layer pattern in the opening 110.

Referring to FIG. 15B, the second mold layer pattern 108 may be etched until an upper surface of the first mold layer pattern 104b may be exposed to form a supporting layer pattern 116 in the trench 106. The first mold layer pattern 104b may be etched. Here, the supporting layer pattern 116 may remain after etching the first mold layer pattern 104b. Thus, the supporting layer pattern 116 may support the lower electrode 115. In some example embodiments, these processes may be substantially same as those illustrated with reference to FIGS. 1F and 1G. A dielectric layer 118 and an upper electrode 120 may be sequentially formed on the lower electrode 115 and the supporting layer pattern 116. According to this example embodiment, the capacitor, which may include the lower electrode having the pillar shape and the supporting layer pattern for supporting the lower electrode, may be manufactured. The lower electrode may be formed by filling the opening with the conductive layer, and planarizing the conductive layer. Thus, the method of this example embodiment may not include the process for forming the sacrificial layer pattern after forming the lower electrode. Further, the capacitors of other example embodiments may include the pillar-shaped lower electrode.

Figure 16:
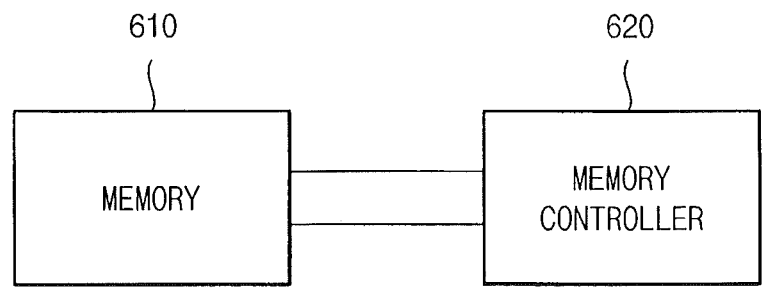

FIG. 16 is a block diagram illustrating a memory system in accordance with some example embodiments. Referring to FIG. 16, a system of this example embodiment may include a memory 610 and a memory controller 620 connected with the memory 610. Here, the memory 610 may include the DRAM device of any one of above-mentioned embodiments. The memory controller 620 may input control signals for controlling operations of the memory 610 into the memory 610. Thus, the memory controller 620 may control the memory 610 based on the control signals.

Figure 17:
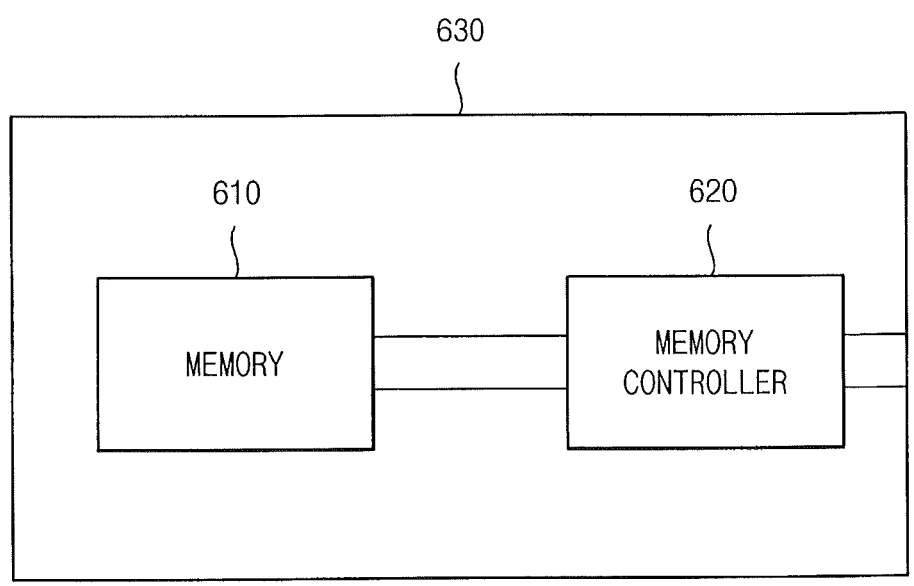

FIG. 17 is a block diagram illustrating a memory system in accordance with some example embodiments. Referring to FIG. 17, a system of this example embodiment may include a memory 610 and the memory controller 620 built in a memory card 630. Here, the memory card 630 may include the DRAM device of any one of above-mentioned embodiments. The memory card 630 may be applied to electronic devices such as a digital camera, a personal computer, etc. The memory controller 620 may control the memory 610 based on control signals from external devices through the memory card 630.

Figure 18:
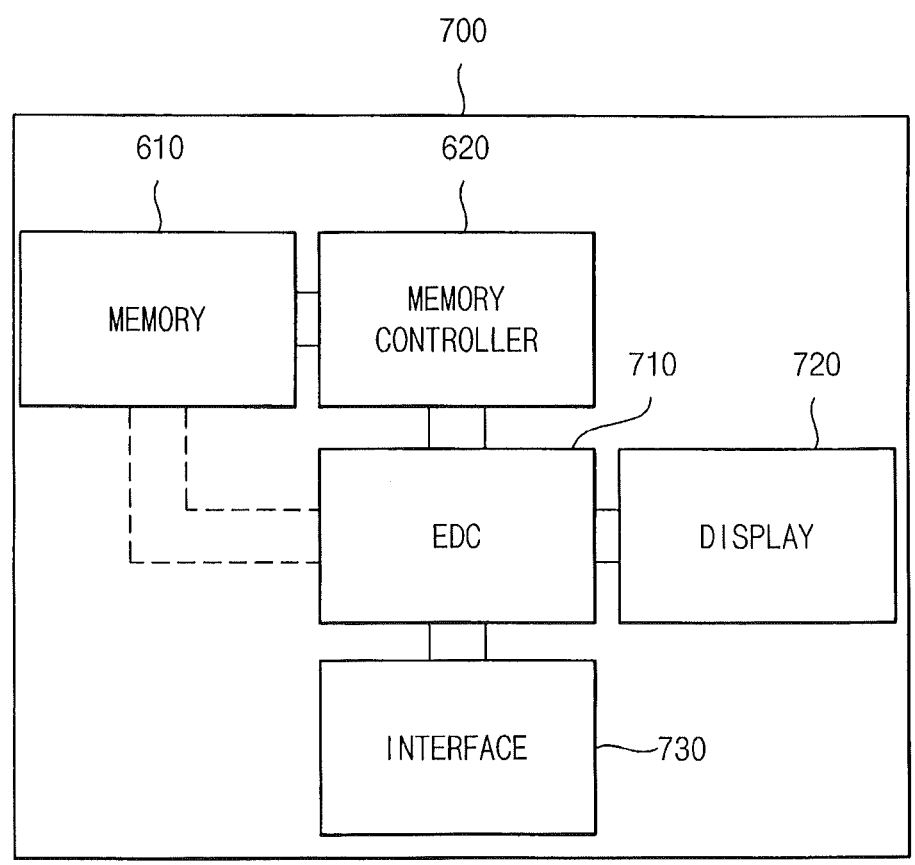

FIG. 18 is a block diagram illustrating a memory system in accordance with some example embodiments. Referring to FIG. 18, a system of this example embodiment may correspond to a portable device 700 having a memory 610 and a memory controller 620. The portable device 700 may include an MP3 player, a video player, a portable multi-media player, etc. The portable device 700 may additionally include an encoder/decoder (EDC) 710, a displayer 720 and an interface 730.

Data may be inputted/outputted into/from the memory 610 through the memory controller 620 by the encoder/decoder 710. The data may be directly inputted into the memory 610. Further, the data may be outputted from the encoder/decoder 710 from the memory 610. The encoder/decoder 710 may encode the data in the memory 610. For example, the encoder/decoder 710 may perform an MP3 encoding and a PMP encoding for storing the data in an audio player and a video player. Alternatively, the encoder/decoder 710 may perform an MPEG encoding for storing video data in the memory 610.

Further, the encoder/decoder 710 may include a multi-encoder for encoding data having different types in accordance with different formats. For example, the encoder/decoder 710 may include an MP3 encoder for audio data and an MPEG encoder for video data.

In some example embodiments, the encoder/decoder 710 may include only a decoder. For example, the decoder may receive and transmit data to the memory controller 620 or the memory 610. In some example embodiment, the encoder/decoder 710 may receive data for encoding or encoded data through the interface 730. The interface 730 may include a USB interface. The data may be outputted from the interface 730 through the memory 610. The displayer 720 may display the data outputted from the memory 610 or decoded by the encoder/decoder 710. For example, the displayer 720 may include a speaker jack for outputting audio data, a display screen for outputting video data, etc.

Figure 19:
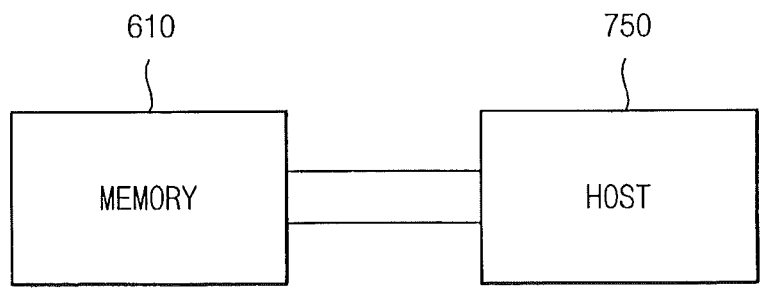

FIG. 19 is a block diagram illustrating a memory system in accordance with some example embodiments. Referring to FIG. 19, a memory 610 may be connected to a host system 750. The host system 750 may include a personal computer, a digital camera, etc. The host system 750 may output control signals for memory 610.

Figure 20:
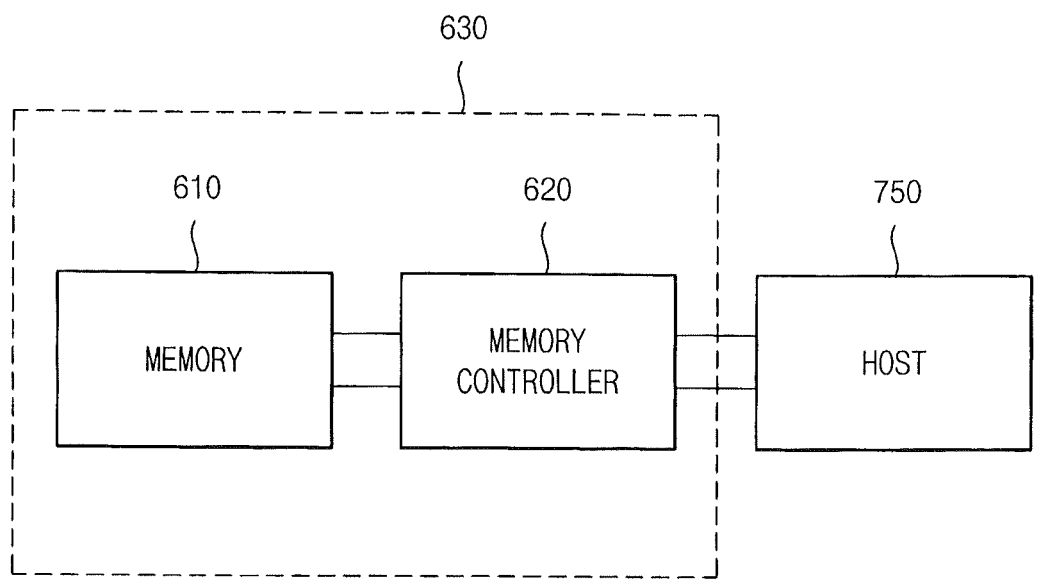

FIG. 20 is a block diagram illustrating a memory system in accordance with some example embodiments. Referring to FIG. 20, a host system 750 may be connected to a memory card 630. The host system 750 may input control signals into the memory controller 620 through the memory card 630. The memory controller 620 may control the memory 610 based on the control signals.

Figure 21:
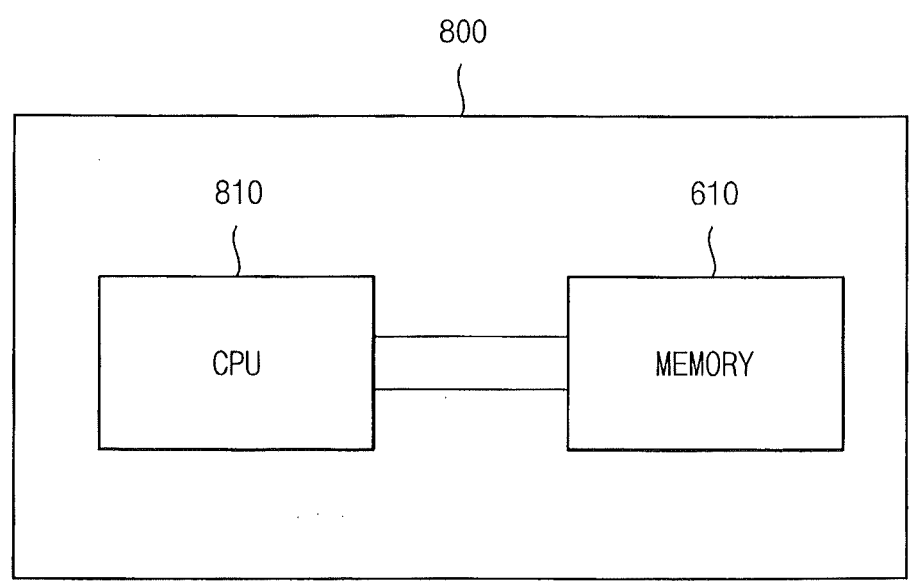

FIG. 21 is a block diagram illustrating a memory system in accordance with some example embodiments. Referring to FIG. 21, a memory 610 may be electrically connected with a central processing unit (CPU) 810 in a computer system 800. The computer system 800 may include a personal computer, a personal data assistant, etc. The memory 610 may be directly connected with the CPU 810. Alternatively, the memory 610 may be connected to the CPU 810 through a bus.

According to these example embodiments, the supporting layer pattern may support the lower electrode to prevent the lower electrode from leaning. Further, a position of the supporting layer pattern may be readily changed by controlling thicknesses of the mold layers, so that the supporting layer pattern may be accurately located at a central portion of the lower electrode, thereby prevent the central portion of the lower electrode from being bent.

Accordingly, as illustrated and described hereinabove with respect to, among other things, FIGS. 1A-1H and 2-4, methods of forming integrated circuit capacitors according to embodiments of the invention include forming a first cylindrical capacitor electrode 112 having a U-shaped cross-section, on a substrate 100, and then forming an electrically insulating support 116 that directly contacts and wraps around at least a first portion of an outer surface of the first cylindrical capacitor electrode 112. A capacitor dielectric layer 118 is formed on an interior surface of the first cylindrical capacitor electrode 112, a second portion of an outer surface of the first cylindrical capacitor electrode not covered by the electrically insulating support and also on the electrically insulating support 116. The capacitor dielectric layer 118 includes an electrically insulating material different from the electrically insulating support 116. Thereafter, an upper capacitor electrode 120 is formed on the capacitor dielectric layer 118 and on a portion of the electrically insulating support 116 that is separated from the upper capacitor electrode 120 by the capacitor dielectric layer 118.

The methods may also include forming a second cylindrical capacitor electrode 112 having a U-shaped cross-section, adjacent the first cylindrical capacitor electrode 112. According to these embodiments of the invention, the step of forming an electrically insulating support 116 includes forming an electrically insulating support that directly contacts and wraps around at least a first portion of an outer surface of the second cylindrical capacitor electrode 112, as illustrated by FIG. 4.

Additional embodiments of the invention include forming an integrated circuit capacitor by forming a first mold layer 104 of a first material on a substrate and forming a trench 106 in an upper surface of the first mold layer 104. A second mold layer 108 is formed in the trench 106 and on an upper surface of the first mold layer 104a. The second mold layer 108 includes a second material different from the first material. These methods may also include forming an opening 110 that extends through at least a portion of the second mold layer 108a in the trench 106 and at least partially through the first mold layer 104b at a location adjacent a bottom of the trench 106. A U-shaped capacitor electrode 112 is then formed in the opening 110. Thereafter, as illustrated by FIGS. 1F-1G, at least a portion of the first mold layer 104b is selectively removed to expose at least a portion of the second mold layer 116 that at least partially wraps around the U-shaped capacitor electrode 112. As illustrated by FIG. 1H, an exterior portion of the U-shaped capacitor electrode 112 and the exposed portion of the second mold layer is then covered with a capacitor dielectric layer 118, and an upper capacitor electrode 120 is formed on the capacitor dielectric layer 118.

According to some of these embodiments of the invention and illustrated by FIGS. 1E-1F, the step of selectively removing at least a portion of the first mold layer 104b is preceded by selectively etching back the second mold layer 108a to expose a sidewall of the trench 106. In addition, as illustrated by FIGS. 1F-1G, the step of selectively removing at least a portion of the first mold layer 104b includes etching the first mold layer 104b using an etchant that is selective to the first mold layer 104b relative to the second mold layer 108a.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A capacitor comprising:
   lower electrodes provided on a substrate;
   a first supporting layer pattern supporting the lower electrodes, the first supporting layer pattern making contact with central sidewall portions of the lower electrodes and connecting adjacent unbent ones of the lower electrodes;

a second supporting layer pattern supporting the lower electrodes, the second supporting layer pattern making contact with upper sidewall portions of the lower electrodes;

a dielectric layer provided on the lower electrodes and on the first and second supporting layer patterns; and an upper electrode provided on the dielectric layer, wherein the upper electrode completely fills a gap between opposing sidewalls of the dielectric layer, wherein the gap at least partially overlaps the first and second supporting layer patterns, wherein the upper electrode has a substantially larger volume than the lower electrodes, and wherein at least one of the first and second supporting layer patterns has an extending linear shape.

2. The capacitor of claim 1, wherein the first and second supporting layer patterns have the extending linear shape and make contact with at least a portion of the sidewall portions of the lower electrodes.

3. The capacitor of claim 1, wherein the first and second supporting layer patterns have different shapes.

4. The capacitor of claim 3, wherein the first supporting layer pattern has the extending linear shape and makes contact with at least a portion of the sidewall portions of the lower electrodes, and wherein the second supporting layer pattern has a meshed shape.

5. The capacitor of claim 4, wherein the second supporting layer patterns wrap around the upper sidewall portions of the lower electrodes and include holes between the lower electrodes.

6. The capacitor of claim 1, wherein an upper surface of the second supporting layer pattern is positioned under an uppermost surface of the lower electrodes.

7. The capacitor of claim 1, wherein the upper surface of the second supporting layer pattern is positioned at a same plane as the uppermost surface of the lower electrodes.

8. The capacitor of claim 1, wherein the first and second supporting layer patterns includes insulating material.

9. The capacitor of claim 1, wherein at least one of the first and second supporting layer patterns includes.

10. The capacitor of claim 9, wherein the non-doped oxide includes at least one selected from the group consisting of USG (undoped silicate glass), SOG (spin on glass), TEOS (tetraethyl orthosilicate) and PE-TEOS (plasma-enhanced tetraethyl orthosilicate).

11. The capacitor of claim 1, wherein one of the first and second supporting layer patterns includes non-doped oxide and a remaining supporting layer pattern includes silicon nitride.

12. The capacitor of claim 1, wherein the first and second supporting layer patterns include silicon nitride.

13. A capacitor comprising:

lower electrodes provided on a substrate;

a first supporting layer pattern supporting the lower electrodes, the first supporting layer pattern extending in a linear shape and making contact with first sidewall portions of the lower electrodes and connecting adjacent unbent ones of the lower electrodes;

a second supporting layer pattern supporting the lower electrodes, the second supporting layer pattern having first and second spaced-apart portions and a meshed shape and making contact with second sidewall portions of the lower electrodes;

a dielectric layer provided on the lower electrodes and the first and second supporting layer patterns; and an upper electrode provided on the dielectric layer, wherein a portion of the upper electrode extends between the first and second spaced-apart portions of the second supporting layer pattern.

14. The capacitor of claim 13, wherein the first supporting layer pattern extends while making contact with at least a portion of the sidewall portions of the lower electrodes.

15. The capacitor of claim 13, wherein the second supporting layer pattern wraps around the upper sidewall portions of the lower electrodes and include holes between the lower electrodes.

16. The capacitor of claim 13, wherein an upper surface of the second supporting layer pattern is positioned under an uppermost surface of the lower electrodes.

17. The capacitor of claim 13, wherein at least one of the first and second supporting layer patterns includes non-doped oxide.

18. The capacitor of claim 17, wherein the non-doped oxide includes at least one selected from the group consisting of USG (undoped silicate glass), SOG (spin on glass), TEOS (tetraethyl orthosilicate) and PE-TEOS (plasma-enhanced tetraethyl orthosilicate).

19. The capacitor of claim 17, wherein one of the first and second supporting layer patterns includes the non-doped oxide and a remaining supporting layer pattern includes silicon nitride.

20. The capacitor of claim 17, wherein the first sidewall portions include central sidewall portions of the lower electrodes and the second sidewall portions include upper sidewall portions of the lower electrodes.

* * * * *